US008871610B2

(12) United States Patent
Shimomura et al.

(10) Patent No.: US 8,871,610 B2
(45) Date of Patent: Oct. 28, 2014

(54) METHOD FOR MANUFACTURING SOI SUBSTRATE

(75) Inventors: Akihisa Shimomura, Kanagawa (JP); Masaki Koyama, Kanagawa (JP); Eiji Higa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 172 days.

(21) Appl. No.: 12/568,768

(22) Filed: Sep. 29, 2009

(65) Prior Publication Data

US 2010/0087047 A1   Apr. 8, 2010

(30) Foreign Application Priority Data

Oct. 2, 2008   (JP) .................. 2008-257762

(51) Int. Cl.
*H01L 21/30* (2006.01)
*H01L 21/762* (2006.01)
(52) U.S. Cl.
CPC .............. *H01L 21/76254* (2013.01)
USPC ........................................ 438/459
(58) Field of Classification Search
CPC .......... H01L 21/76264; H01L 21/76243; H01L 21/76251
USPC ............ 438/406, 423, 455, 458, 459; 257/E21.567
See application file for complete search history.

(56) References Cited

U.S. PATENT DOCUMENTS

| 5,374,564 | A | * | 12/1994 | Bruel | ............. 438/455 |
| 5,492,859 | A | * | 2/1996 | Sakaguchi et al. | ............. 438/459 |
| 5,854,123 | A |   | 12/1998 | Sato et al. | |
| 5,953,622 | A | * | 9/1999 | Lee et al. | ............. 438/458 |
| 6,110,845 | A | * | 8/2000 | Seguchi et al. | ............. 438/795 |
| 6,143,628 | A |   | 11/2000 | Sato et al. | |
| 6,146,979 | A | * | 11/2000 | Henley et al. | ............. 438/458 |
| 6,221,738 | B1 |   | 4/2001 | Sakaguchi et al. | |
| 6,245,645 | B1 |   | 6/2001 | Mitani et al. | |
| 6,251,754 | B1 | * | 6/2001 | Ohshima et al. | ............. 438/506 |
| 6,287,988 | B1 |   | 9/2001 | Nagamine et al. | |
| 6,306,730 | B2 |   | 10/2001 | Mitani et al. | |
| 6,323,108 | B1 | * | 11/2001 | Kub et al. | ............. 438/458 |

(Continued)

FOREIGN PATENT DOCUMENTS

EP   0977255 A   2/2000
JP   11-097379 A   4/1999

(Continued)

*Primary Examiner* — Fernando L Toledo
*Assistant Examiner* — Neil Prasad
(74) *Attorney, Agent, or Firm* — Eric J. Robinson; Robinson Intellectual Property Law Office, P.C.

(57) ABSTRACT

To increase adhesion between a single crystal semiconductor layer and a base substrate and to reduce bonding defects therebetween. To perform radical treatment on a surface of a semiconductor substrate to form a first insulating film on the semiconductor substrate; irradiate the semiconductor substrate with accelerated ions through the first insulating film to form an embrittlement region in the semiconductor substrate; form a second insulating film on the first insulating film; perform heat treatment after bonding a surface of the second insulating film and a surface of the base substrate to perform separation along the embrittlement region so that a semiconductor layer is formed over the base substrate with the first and second insulating films interposed therebetween; etch the semiconductor layer; and irradiate the semiconductor layer on which the etching is performed with a laser beam.

16 Claims, 13 Drawing Sheets

(56) References Cited

U.S. PATENT DOCUMENTS

| | | |
|---|---|---|
| 6,372,609 B1 | 4/2002 | Aga et al. |
| 6,468,884 B2 | 10/2002 | Miyake et al. |
| 6,468,923 B1 * | 10/2002 | Yonehara et al. ............. 438/455 |
| 6,534,380 B1 | 3/2003 | Yamauchi et al. |
| 6,569,748 B1 | 5/2003 | Sakaguchi et al. |
| 6,979,630 B2 * | 12/2005 | Walitzki ........................ 438/459 |
| 7,192,844 B2 | 3/2007 | Couillard et al. |
| 7,405,136 B2 * | 7/2008 | Delprat et al. ................ 438/458 |
| 7,820,495 B2 | 10/2010 | Dairiki et al. |
| 8,361,845 B2 | 1/2013 | Dairiki et al. |
| 8,501,589 B2 * | 8/2013 | Fournel et al. ................ 438/459 |
| 2007/0117406 A1 | 5/2007 | Saito |
| 2007/0141803 A1 * | 6/2007 | Boussagol et al. ............ 438/455 |

FOREIGN PATENT DOCUMENTS

| | | |
|---|---|---|
| JP | 2000-030996 A | 1/2000 |
| JP | 2000-124092 | 4/2000 |
| JP | 2000-235975 A | 8/2000 |
| JP | 2001-203340 A | 7/2001 |
| JP | 2002-289611 A | 10/2002 |
| JP | 2006-120965 A | 5/2006 |
| JP | 2007-043121 A | 2/2007 |

* cited by examiner

FIG. 4A1
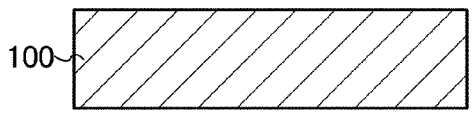
FIG. 4B1
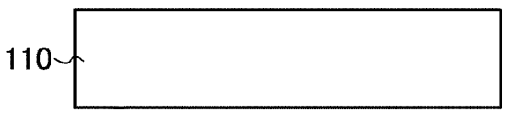
FIG. 4A2
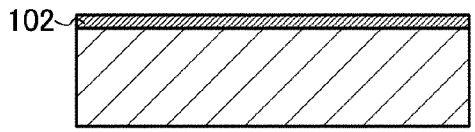
FIG. 4B2
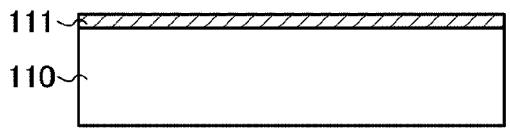
FIG. 4A3
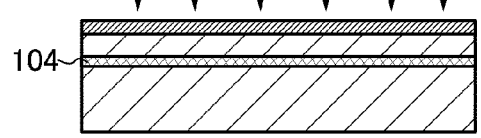
FIG. 4A4
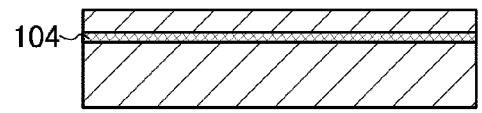
FIG. 4A5
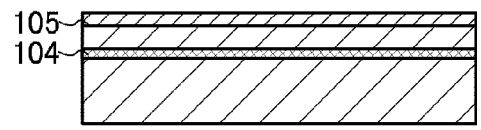
FIG. 4C
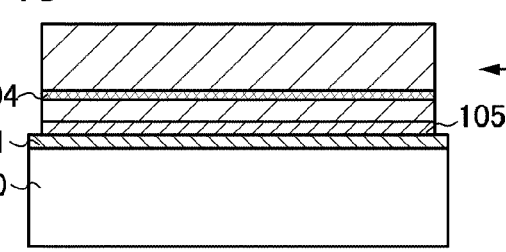
FIG. 4D
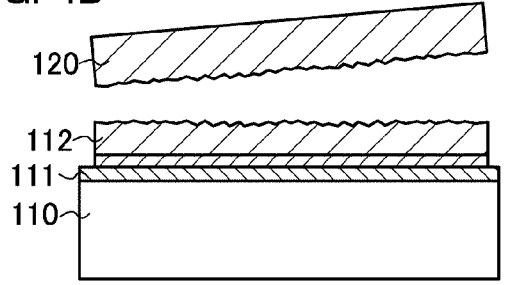

METHOD FOR MANUFACTURING SOI SUBSTRATE

BACKGROUND OF THE INVENTION

1. Field of the Invention

The present invention relates to a method for manufacturing a substrate provided with a semiconductor layer with an insulating film interposed therebetween, and especially, a method for manufacturing an SOI (silicon on insulator) substrate. In addition, the present invention relates to a method for manufacturing a semiconductor device using a substrate provided with a semiconductor layer with an insulating film interposed therebetween.

2. Description of the Related Art

In recent years, an integrated circuit using an SOI (silicon on insulator) substrate in which a thin single crystal semiconductor layer is formed over an insulating surface, instead of using a bulk silicon wafer, has been developed. Since parasitic capacitance between a drain of a transistor and a substrate is reduced by using the SOI substrate, the SOI substrate has attracted attention as one improving performance of a semiconductor integrated circuit.

A Smart Cut (registered trademark) method is known as one of methods for manufacturing an SOI substrate (for example, see Patent Document 1). An outline of a method for manufacturing an SOI substrate by a Smart Cut (registered trademark) method is described below. First, hydrogen ions are implanted into a silicon wafer by an ion implantation method, so that an embrittlement region is formed at a predetermined depth from a surface. Then, the silicon wafer into which the hydrogen ions are implanted is bonded to another silicon wafer with a silicon oxide film interposed therebetween. Then, by heat treatment, part of the silicon wafer into which hydrogen ions have been implanted is separated in a thin film shape along the embrittlement region which serves as a cleavage plane; accordingly, a single crystal silicon film can be formed over the other silicon wafer that has been bonded. A Smart Cut (registered trademark) method is also referred to as a hydrogen ion implantation separation method.

REFERENCE

Patent Document

[Patent Document 1]

Japanese Published Patent Application No. 2000-124092

In order to prevent a surface of a silicon wafer from becoming rough by hydrogen ion irradiation when an embrittlement region is formed in the silicon wafer, an insulating film is formed on the surface of the silicon wafer and then hydrogen ion irradiation is performed. However, the surface of the insulating film becomes rough by the hydrogen ion irradiation. That is, unevenness is generated on the surface of the insulating film.

In order to prevent such surface unevenness, another insulating film can be further formed after the hydrogen ion irradiation; however, the manufacturing cost is increased because the insulating films should be formed thick. In addition, since the surface of the insulating film that has been formed previously has a rough surface, even when the insulating films are deposited thick, the surface unevenness of the insulating film is further increased. When the insulating film having such surface unevenness is bonded to a base substrate, local gaps called voids are generated at the bonding surface due to the surface unevenness of the insulating film, resulting in reducing the bonding strength.

A single crystal silicon film should also be formed thick in order to be applied for a power MOS, a solar battery, or the like. The thickness of the single crystal silicon film formed over the base substrate depends on the depth of the embrittlement region, and the depth of the embrittlement region depends on the thickness and quality of the insulating film formed on the surface of the silicon wafer and the accelerating voltage of ion irradiation. Thus, as the thickness of the insulating film formed on the surface of the silicon wafer is larger, the thickness of the single crystal silicon film formed over the base substrate becomes smaller correspondingly. In addition, when there are variations in the thickness and quality of the insulating film, the embrittlement region cannot be formed at a uniform depth, and thus a single crystal silicon film is difficult to be formed uniformly.

In view of the above problems, an object of an embodiment of the present invention is to improve adhesion between the single crystal semiconductor layer and the base substrate for reduction of bonding defects. Another object is to provide a method for manufacturing an SOI substrate having sufficient adhesion even in a bonding step and also in a process of manufacturing a semiconductor device.

SUMMARY OF THE INVENTION

An embodiment of the present invention is a method including the steps of: performing radical treatment on a surface of a semiconductor substrate to form a first insulating film on the semiconductor substrate; irradiating the semiconductor substrate with accelerated ions through the first insulating film to form an embrittlement region in the semiconductor substrate; forming a second insulating film over the first insulating film; bonding a surface of the second insulating film and a surface of a base substrate so that the semiconductor substrate and the base substrate face to each other; performing heat treatment after the bonding of the surface of the second insulating film and the surface of the base substrate to perform separation along the embrittlement region so that a semiconductor layer is formed over the base substrate with the first and second insulating films interposed therebetween; etching the semiconductor layer; and irradiating the semiconductor layer on which the etching is performed with a laser beam.

Another embodiment of the present invention is a method including the steps of: performing radical treatment on a surface of a semiconductor substrate to form a first insulating film on the semiconductor substrate; irradiating the semiconductor substrate with accelerated ions through the first insulating film to form an embrittlement region in the semiconductor substrate; removing the first insulating film by etching; forming a second insulating film over the semiconductor substrate; bonding a surface of the second insulating film and a surface of a base substrate so that the semiconductor substrate and the base substrate face to each other; performing heat treatment after the bonding of the surface of the second insulating film and the surface of the base substrate to perform separation along the embrittlement region so that a semiconductor layer is formed over the base substrate with the second insulating film interposed therebetween; etching the semiconductor layer; and irradiating the semiconductor layer on which the etching is performed with a laser beam.

In the radical treatment in this specification, plasma is generated in a position away from a substrate and a long-lived neutral atom or neutral molecule among activated atoms or molecules is transferred and reacted with a process object.

Unlike in an insulating film formed by a vapor-phase deposition method, in an insulating film formed by radical treatment, surface unevenness due to dust is unlikely to be generated and high planarity can be obtained.

The first insulating film can be a silicon oxide film, a silicon nitride film, a silicon oxynitride film, or a silicon nitride oxide film. In this specification, a silicon oxynitride film refers to a film that contains more oxygen than nitrogen and preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively, in the case where measurements are performed using Rutherford backscattering spectrometry (RBS) and hydrogen forward scattering (HFS). Further, a silicon nitride oxide film refers to a film that contains more nitrogen than oxygen and preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively, in the case where measurements are performed using RBS and HFS. Note that percentages of nitrogen, oxygen, silicon, and hydrogen fall within the ranges given above, where the total number of atoms contained in the silicon oxynitride or the silicon nitride oxide is defined as 100 at. %.

The base substrate is a substrate formed using an insulator. Specifically, a variety of glass substrates that are used in the electronics industry, such as an aluminosilicate glass substrate, an aluminoborosilicate glass substrate, and a barium borosilicate glass substrate; a quartz substrate; a ceramic substrate; and a sapphire substrate can be used.

The single crystal refers to a crystal in which, when a certain crystal axis is focused, the direction of the crystal axis is oriented in the same direction in any portion of a sample and which does not have a crystal grain boundary between crystals. Note that, in this specification, the single crystal includes a crystal in which the direction of crystal axes is uniform as described above and which does not have a grain boundary even when it includes a crystal defect or a dangling bond. In addition, re-single-crystallization of a single crystal semiconductor layer means that a semiconductor layer having a single crystal structure returns to a single crystal structure after being in a different state from the single crystal structure (for example, a liquid-phase state). In addition, it can be said that re-single-crystallization of a single crystal semiconductor layer means that a single crystal semiconductor layer is recrystallized to form a single crystal semiconductor layer.

Note that the semiconductor device in this specification refers to all devices capable of functioning utilizing semiconductor characteristics. Electro-optic devices, semiconductor circuits, and electronic devices are all included in semiconductor devices.

In addition, the display device in this specification includes a light-emitting device and a liquid crystal display device. The light-emitting device includes a light-emitting element, and the liquid crystal display device includes a liquid crystal element. The light-emitting element refers to an element, luminance of which is controlled by current or voltage. Specifically, the light-emitting element refers to an inorganic electroluminescence (EL) element, an organic EL element, and the like.

According to an embodiment of the present invention, an SOI substrate can be manufactured in which adhesion between a single crystal semiconductor layer and a base substrate is improved to reduce bonding defects therebetween, and sufficient bonding strength is obtained even in a bonding step and also in a process of manufacturing a semiconductor device.

BRIEF DESCRIPTION OF THE DRAWINGS

In the accompanying drawings:

FIGS. 4A1 to 4D illustrate an example of a method for manufacturing an SOI substrate according to an embodiment of the present invention;

DETAILED DESCRIPTION OF THE INVENTION

Figure 1B:
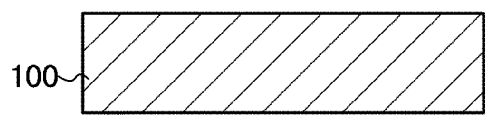
FIGS. 1A1 to 1D illustrate an example of a method for manufacturing an SOI substrate according to an embodiment of the present invention.
Figure 1B:
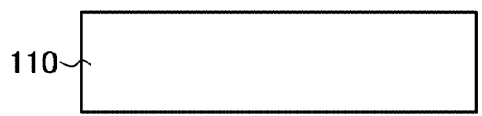
Figure 1B:
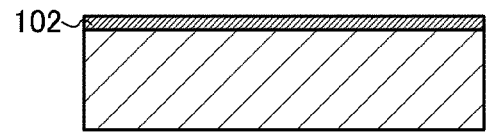
Figure 1B:
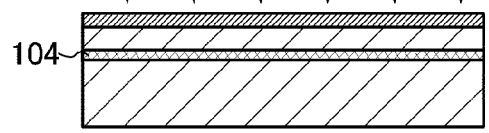
Figure 1B:
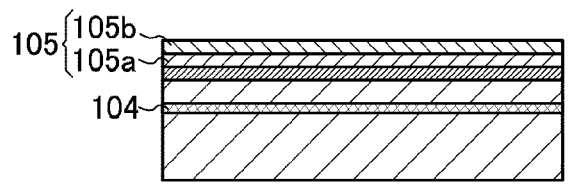

Embodiments of the present invention are hereinafter described with reference to the drawings. However, the present invention can be implemented in various different modes, and it is to be easily understood that various changes and modifications in modes and details thereof will be apparent to those skilled in the art without departing from the meaning and the scope of the present invention. Therefore, it should be noted that the description of embodiments to be given below should not be interpreted as limiting the present invention. Note that the same portions or portions having the same functions are denoted by the same reference numerals in the drawings for the embodiments, and the description thereof will be made only once.

(Embodiment 1)

In this embodiment, a method for manufacturing a substrate provided with a semiconductor layer with an insulating film interposed therebetween (for example, an SOI substrate) by bonding a semiconductor substrate and a base substrate is described with reference to the drawings.

First, a single crystal semiconductor substrate 100 is prepared as a semiconductor substrate (see FIG. 1A1). The single crystal semiconductor substrate 100 can be a single crystal semiconductor substrate or a polycrystalline semiconductor substrate; for example, a single crystal or polycrystalline silicon substrate, a single crystal or polycrystalline germanium substrate, and a compound semiconductor substrate of gallium arsenide, indium phosphide, or the like can be used. The shape of a commercial silicon substrate is typically a circular shape, and the size thereof is typically 5 inches (125 mm) in diameter, 6 inches (150 mm) in diameter, 8 inches (200 mm) in diameter, 12 inches (300 mm) in diameter, and 16 inches (400 mm) in diameter. Note that the shape is not limited to a circular shape, and a silicon substrate processed to have a rectangular shape or the like can also be used. In the description below, a single crystal silicon substrate is used as the single crystal semiconductor substrate 100.

A surface of the single crystal semiconductor substrate 100 is preferably cleaned in advance using a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), or the like as appropriate in order to remove contamination. Alternatively, dilute hydrogen fluoride and ozone water may be discharged alternately in the cleaning.

Then, an insulating film 102 is formed over the single crystal semiconductor substrate 100. The insulating film 102 is formed in order to suppress surface roughness of the single crystal semiconductor substrate in a subsequent ion irradiation step. Note that uniformity in thickness of a single crystal semiconductor layer 112 to be provided over a base substrate 110 depends on uniformity in depth of an embrittlement region 104 formed in the single crystal semiconductor substrate 100. The uniformity in the depth of the embrittlement region 104 depends on the thickness and quality of the insulating film 102. Thus, the insulating film 102 preferably has high uniformity in thickness and quality. In addition, it is preferable to form the insulating film 102 thin in order to form the single crystal semiconductor layer 112 thick, which is provided over the base substrate 110.

The insulating film 102 (also referred to as a first insulating film) is formed by performing radial treatment on the single crystal semiconductor substrate 100 in order to form an insulating film having high uniformity in thickness and quality (see FIG. 1A2). The radical treatment in this specification means treatment in which plasma is generated in a position away from the substrate and a long-lived neutral atom or neutral molecule among activated atoms or molecules is transferred and reacted with a process object. In addition, a radical refers to an atom or a molecule in an electronically-excited state, to which the electron state is transferred from a normal (ground) state in which an electron is stable.

As the insulating film 102, a silicon oxide film, a silicon nitride film, a silicon oxynitride film, or a silicon nitride oxide film can be used. As a method for forming a silicon oxide film as the insulating film 102, there is a method in which a gas containing oxygen, for example, oxygen ($O_2$) or dinitrogen monoxide ($N_2O$), is exited to generate oxygen radicals and the single crystal semiconductor substrate 100 is oxidized by the oxygen radicals (also referred to as oxygen radical treatment). As a method for forming a silicon nitride film, there is a method in which a gas containing nitrogen, for example, a nitrogen gas, an ammonia gas, or the like, is exited to generate nitrogen radicals or hydrogen nitride radicals and the single crystal semiconductor substrate 100 is nitrided by the nitrogen radicals or hydrogen nitride radicals (also referred to as nitrogen radical treatment). Note that the radical treatment in this specification refers to radical treatment such as oxygen radical treatment or nitrogen radical treatment.

As a method for forming a silicon oxynitride film as the insulating film 102, there is a method in which a surface of the single crystal semiconductor substrate 100 is oxidized through oxidation treatment using oxygen radicals to form a silicon oxide film and the surface of the silicon oxide film is nitrided through nitridation treatment using nitrogen radicals. As a method for forming a silicon nitride oxide film, there is a method in which a surface of the single crystal semiconductor substrate 100 is nitrided through nitridation treatment using nitrogen radicals to form a silicon nitride film and the surface of the silicon nitride film is oxidized through oxidation treatment using oxygen radicals.

In a case of performing oxidation treatment using oxygen radicals or nitridation treatment using nitrogen radicals or hydrogen nitride radicals, plasma is preferably generated by exciting gas with microwaves. This is because high-density plasma having an electron density of $1 \times 10^{11}$ $cm^{-3}$ or more and an electron temperature of 3 eV or less can be generated. A typical frequency of a microwave for generating high-density plasma is 2.45 GHz. By using high-density plasma, an insulating film can be formed at a practical reaction rate at a heat temperature of less than or equal to 550° C. That is, high-density plasma is generated using a microwave, and radicals generated in the high-density plasma are reacted with a process object, resulting in oxidation or nitridation of the process object by a solid-phase reaction at a low heat temperature of the substrate, which is less than or equal to 550° C., in a short time.

Figure 2A:
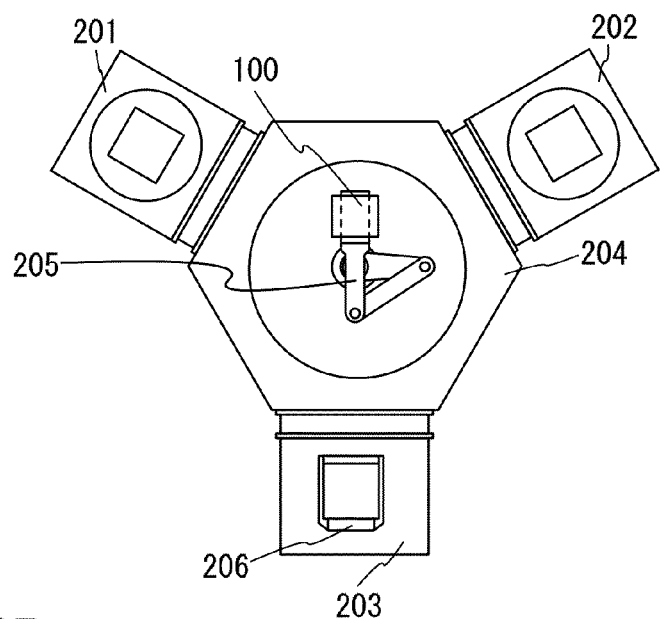
FIGS. 2A and 2B illustrate an example of a structure of a high-density plasma treatment apparatus.
Figure 2B:
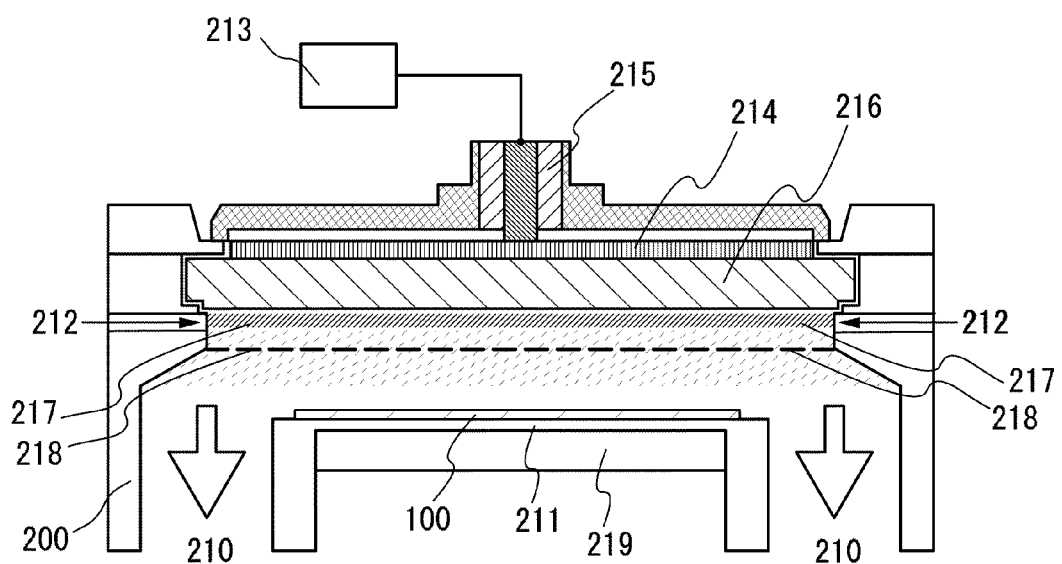

FIGS. 2A and 2B illustrate an example of a structure of a high-density plasma treatment apparatus for performing various kinds of treatment using high-density plasma excited with a microwave. Treatment using high-density plasma includes oxidation treatment, nitridation treatment, oxynitridation treatment, nitridation and oxidation treatment, hydrogenation treatment, surface modification treatment, and the like on a semiconductor material, an insulating material, and a conductive material. A desired treatment can be performed by changing gas to be plasma-excited.

The high-density plasma treatment apparatus illustrated in FIG. 2A has a multi-chamber structure, which is provided with at least a first plasma treatment chamber 201, a second plasma treatment chamber 202, a load lock chamber 203, and a common chamber 204. The first plasma treatment chamber 201 is a chamber for performing radical oxidation, and the second plasma treatment chamber 202 is a chamber for performing radical nitridation. Each of the chambers illustrated in FIG. 2A is evacuated and radical oxidation and radical nitridation can be performed consecutively without exposing the single crystal semiconductor substrate 100 to the air.

The high-density plasma treatment apparatus may be provided with a chamber capable of performing treatment other than radical oxidation and radical nitridation, such as a CVD chamber, a sputtering chamber, a dry etching chamber, an ion doping chamber, or a heat treatment chamber, in addition to the one illustrated in FIG. 2A.

FIG. 2B illustrates a common structure in the first plasma treatment chamber 201 and the second plasma treatment chamber 202. A plasma treatment chamber 200 is provided with a stage 211 for disposing the single crystal semiconductor substrate 100, a shower plate 218 connected to a gas supply portion 212, and an exhaust port 210 connected to a vacuum pump for exhausting the plasma treatment chamber 200. The upper portion of the plasma treatment chamber 200 is provided with an antenna 214, a dielectric plate 216, a coaxial waveguide 215 connected to a microwave generator 213. In addition, by providing the stage 211 with a temperature controller 219, the temperature of the single crystal semiconductor substrate 100 can be controlled.

In order to perform radical treatment, a predetermined gas is supplied from the gas supply portion 212. The gas passes through holes in the shower plate 218 to be introduced into the plasma treatment chamber 200. A microwave with a frequency of 2.45 GHz is generated from the microwave generator 213 to be supplied to the coaxial waveguide 215. The microwave passes through the coaxial waveguide 215, the antenna 214 and the dielectric plate 216, and is supplied into the plasma treatment chamber 200. The microwave excites the gas supplied into the plasma treatment chamber 200 to generate high-density plasma. The distance between the stage 211 and the shower plate 218 (hereinafter also referred to as the electrode distance) can be from 20 mm to 80 mm inclusive, preferably from 20 mm to 60 mm inclusive. In addition, radical treatment can be performed while heating the single crystal semiconductor substrate 100 with the use of the temperature controller 219.

In a case where oxygen radical treatment is performed, gas to be plasma-excited preferably includes a rare gas as well as a gas containing oxygen. Note that the gas containing oxygen includes, for example, oxygen ($O_2$), dinitrogen monoxide ($N_2O$), or the like. In addition, also in a case where nitrogen radical treatment is performed, gas to be plasma-excited preferably includes a rare gas as well as a gas containing nitrogen. Note that the gas containing nitrogen includes, for example, nitrogen ($N_2$), ammonia ($NH_3$), or the like. By adding a rare gas, oxygen radicals (hereinafter expressed as O*) or nitrogen radicals (hereinafter expressed as N*) can be efficiently generated in plasma. As the rare gas, one or more selected from He, Ne, Ar, Kr, and Xe can be used. In order to generate high-density plasma, it is preferable to use Ar, Kr, and/or Xe having a large atomic radius.

An example of a method for performing oxygen radial treatment on the single crystal semiconductor substrate 100 with the use of the high-density plasma treatment apparatus illustrated in FIGS. 2A and 2B is described. $O_2$ and Kr are each supplied from the gas supply portion 212 into the plasma treatment chamber 200. Then, by introducing a microwave also into the plasma treatment chamber 200, plasma of a mixed gas of $O_2$ and Kr is generated. In this plasma, Kr is excited by the introduced microwave and Kr radicals (hereinafter expressed as Kr*) are generated, and by collision between the Kr* and oxygen molecules ($O_2$), O* is generated. Then, O* generated in plasma reacts with the single crystal semiconductor substrate 100 on the stage 211, so that the single crystal semiconductor substrate 100 is oxidized. In addition, by exciting hydrogen ($H_2$) gas as well as the gas containing oxygen and the rare gas, OH radicals (hereinafter expressed as OH*) are generated in plasma and the single crystal semiconductor substrate 100 can also be oxidized by OH*. The heat temperature for the oxygen radical treatment can be in a range of 300° C. to 550° C. inclusive. The pressure is preferably from 100 Pa to 140 Pa inclusive.

Next, an example of a method for performing nitrogen radical treatment on the single crystal semiconductor substrate 100 with the use of the high density plasma treatment apparatus illustrated in FIGS. 2A and 2B is described. $N_2$ and Kr are each supplied from the gas supply portion 212 into the plasma treatment chamber 200. Then, by introducing a microwave also into the plasma treatment chamber 200, plasma of a mixed gas of $N_2$ and Kr is generated. In this plasma, Kr is excited by the introduced microwave and Kr radicals (hereinafter expressed as Kr*) are generated and by collision between the Kr* and nitrogen molecules, N* is generated. Then, N* generated in plasma reacts with the single crystal semiconductor substrate 100 on the stage 211, so that the single crystal semiconductor substrate 100 is nitrided. In addition, by exciting a mixed gas of $N_2$, $H_2$ and a rare gas, or a mixed gas of $NH_3$ and a rare gas, nitrogen radical treatment can be performed. In plasma of these mixed gases, N* and NH radicals (hereinafter expressed as NH*) are generated, and the single crystal semiconductor substrate 100 can be nitrided by N* and NH*. The heat temperature for the nitrogen radial treatment can be in a range of 300° C. to 550° C. inclusive. The pressure is preferably from 5 Pa to 15 Pa inclusive.

An example of a method for forming the insulating film 102 by radical treatment is described. First, O* is generated by high-density plasma, and a surface of the single crystal semiconductor substrate 100 is oxidized to form a silicon oxide film with a thickness of 1 nm to 10 nm. Further, nitrogen radicals may be generated by high-density plasma, and an upper portion of the silicon oxide film may be nitrided by the nitrogen radicals. The silicon oxide film can be nitrided to form a silicon oxynitride film. Alternatively, nitrogen radicals are generated by high-density plasma, and a surface of the single crystal semiconductor substrate 100 is nitrided to form a silicon nitride film with a thickness of 1 nm to 10 nm. Further, oxygen radicals may be generated by high-density plasma, and an upper portion of the silicon nitride film may be oxidized by the oxygen radicals. The silicon nitride film can be oxidized to form a silicon nitride oxide film.

By the radical treatment, an interface of the silicon can be planarized at an atomic level by a neutral atom or a neutral molecule which does not cause much damage to the substrate and has a high reactivity. At the same time, dangling bonds at the silicon interface are terminated, resulting in forming an insulating film with a high quality, that is, an insulating film having a low interface state density and few fixed charges. Accordingly, an insulating film having high uniformity in thickness and quality can be formed by the radical treatment. In addition, since oxidation or nitridation of the single crystal semiconductor substrate 100 in the radical treatment can be controlled at an atomic level, the insulating film 102 with an extremely small thickness (about several nm) can be formed.

Next, the single crystal semiconductor substrate 100 is irradiated with ions 103 having kinetic energy so as to form the embrittlement region 104 where a crystalline structure is damaged at a predetermined depth in the single crystal semiconductor substrate 100 (see FIG. 1A3). As illustrated in FIG. 1A3, the single crystal semiconductor substrate 100 is irradiated with accelerated ions 103 through the insulating film 102 so that the ions 103 can be introduced into a region at a predetermined depth from a surface of the single crystal semiconductor substrate 100 and the embrittlement region 104 can be formed. The ions 103 are accelerated ions obtained by excitation of a source gas to generate plasma of the source gas, and then extraction of ions contained in the plasma by an effect of an electric field.

The depth of the region where the embrittlement region 104 is formed can be adjusted by the kinetic energy, mass, electric charge, or incidence angle of the ions 103. In addition, the kinetic energy can be adjusted by accelerating voltage or the like. Alternatively, the depth of the embrittlement region 104 can be adjusted by the thickness of the insulating film 102. The embrittlement region 104 is formed at almost the same depth as the average depth of the introduced ions 103. Accordingly, the thickness of the semiconductor layer to be separated from the single crystal semiconductor substrate 100 depends on the depth to which the ions 103 are added. The depth of the embrittlement region 104 is adjusted so that the semiconductor layer is formed to have a thickness of 110 nm to 500 nm inclusive, preferably, 200 nm to 350 nm inclusive. In a case where the thickness of the semiconductor layer is 300 nm, for example, irradiation may be performed so that the peak value of the ion profile in a depth direction is 300 nm.

The embrittlement region 104 can be formed by ion doping treatment. The ion doping treatment can be performed using an ion doping apparatus. An ion doping apparatus is typically a non-mass-separation type apparatus for irradiating an object to be processed which is disposed in a chamber with all kinds of ion species which are generated by plasma excitation of a process gas. The apparatus is called non-mass-separation type apparatus because an object to be processed is irradiated with all kinds of ion species without mass separation of ion species in plasma. In contrast, an ion implantation apparatus is a mass-separation type apparatus. The ion implantation apparatus is an apparatus for irradiating an object to be processed with ion species having a specific mass through mass separation of ion species in plasma.

The ion doping apparatus mainly includes a chamber for disposing a process object, an ion source for generating desired ions, and an acceleration mechanism for acceleration of ions and for irradiation therewith. The ion source includes a gas supply device for supplying a source gas for generating a desired ion species, an electrode for exciting the source gas to generate plasma, and the like. As the electrode for generating plasma, a filament electrode, a capacitive coupling high-frequency discharging electrode, or the like is used. The acceleration mechanism includes electrodes such as an extraction electrode, an acceleration electrode, a deceleration electrode, and a ground electrode; a power supply for supplying power to these electrodes; and the like. These electrodes that are included in the acceleration mechanism are provided with a plurality of openings or slits, through which ions that are generated from the ion source are accelerated. Note that the components of the ion doping apparatus are not limited to the above-described components, and a mechanism as needed is provided.

In this embodiment, the single crystal semiconductor substrate 100 is irradiated with ions using an ion doping apparatus. A hydrogen-containing gas is supplied as a plasma source gas. For example, $H_2$ is supplied. Plasma is generated by excitation of a hydrogen gas. Ions included in plasma are accelerated without mass separation and the single crystal semiconductor substrate 100 is irradiated with the accelerated ions.

In the ion doping apparatus, the percentage of $H_3^+$ to the total quantity of ion species ($H^+$, $H_2^+$, and $H_3^+$) generated from a hydrogen gas is 50% or higher. More preferably, the percentage of $H_3^+$ is 80% or higher. Because mass separation is not performed in the ion doping apparatus, the percentage of one ion species ($H_3^+$) among plural kinds of ion species generated in plasma is preferably 50% or higher, more preferably 80% or higher. By irradiation with ions having the same mass, ions can be added in a concentrated manner to the same depth in the single crystal semiconductor substrate 100. Here, the term "main component" means the ions having the same mass, the percentage of which included in the plural kinds of ion species is 50% or more. In the above, the semiconductor substrate 100 is irradiated with the plurality of ions included $H_3^+$ as the main component.

Ion doping apparatuses are inexpensive and excellent for use in large-area treatment. Therefore, by irradiation with $H_3^+$ using such an ion doping apparatus, significant effects such as an improvement in semiconductor characteristics, an increase in area, a reduction in costs, and an improvement in production efficiency can be obtained. In a case of using an ion doping apparatus, heavy metals can be mixed at the same time; however, irradiation with ions through the insulating film 102 formed by radical treatment can reduce contamination in the single crystal semiconductor substrate 100 due to the heavy metals.

Note that the step of irradiating the single crystal semiconductor substrate 100 with the accelerated ions 103 can also be performed using an ion implantation apparatus. The ion implantation apparatus is a mass-separation type apparatus for irradiating an object to be processed which is disposed in a chamber with a specific ion species through mass separation of a plurality of ion species that are generated by plasma excitation of a source gas. Thus, when an ion implantation apparatus is used, $H^+$ ions and $H_2^+$ ions that are generated by excitation of a hydrogen gas or $PH_3$ are subjected to mass separation, and either $H^+$ ions or $H_2^+$ ions are accelerated, with which the single crystal semiconductor substrate 100 is irradiated.

The insulating film 102 formed by radical treatment has high uniformity in thickness and quality, and a high density. In addition, since the radical treatment can be controlled at an atomic level, it can be formed to an extremely small thickness (about several nm). With the use of the insulating film 102 formed by radical treatment, the single crystal semiconductor substrate 100 can be uniformly irradiated, and ions can be added thereto through the insulating film 102. The high density of the insulating film 102 can reduce surface roughness by the irradiation with ions. Since the thickness of the insulating film 102 is about several nm, ions can be added more deeply than the case where the insulating film 102 is formed to have a thickness of several ten nm Accordingly, in irradiation with ions after the formation of the insulating film 102 by the radical treatment, the embrittlement region can be formed uniformly in a deep region of the single crystal semiconductor substrate 100. As a result, an SOI substrate including a single crystal semiconductor layer with high uniformity in thickness can be manufactured.

Next, an insulating film 105 (also referred to as a second insulating film) is formed over the insulating film 102 (see FIG. 1A4).

The insulating film 105 can have a single layer structure or a multilayer structure including two or more layers. As a film which is used for the insulating film 105, a film containing silicon or germanium as its component can be used; for example, a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including a metal oxide such as aluminum oxide, tantalum oxide, or hafnium oxide; an insulating film including a metal nitride such as aluminum nitride; an insulating film including a metal oxynitride such as an aluminum oxynitride film; or an insulating film including a metal nitride oxide such as an aluminum nitride oxide film can be used as well.

The insulating film 105 can be formed by a chemical vapor deposition (CVD) method, a sputtering method, or an atomic layer epitaxy (ALE) method. As a CVD method, there are a low-pressure CVD method, a thermal CVD method, a plasma-enhanced CVD method (hereinafter referred to as a PECVD method), and the like. A PECVD method is preferable because it is low-temperature treatment at 350° C. or lower and provides a higher deposition rate than other CVD methods.

In this embodiment, an example in which the insulating film 105 is formed to have a two-layer structure of insulating films 105a and 105b is described. After the insulating film 102 is removed, the insulating film 105a and the insulating film 105b are stacked over the single crystal semiconductor substrate 100. The insulating film 105a is preferably formed by a chemical reaction, and silicon oxide is especially preferable. In a case where silicon oxide is formed as the insulating film 105a by a CVD method, an organosilane gas is preferably used as a silicon source gas. An oxygen gas can be used as an oxygen source gas. As an organosilane gas, the following can be employed: ethyl oxide (TEOS, chemical formula: $Si(OC_2H_5)_4$), trimethylsilane (TMS: $(CH_3)_3SiH$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), or trisdimethylaminosilane (SiH(N(CH$_3$)$_2$)$_3$).

The silicon oxide film to be the insulating film 105a can be formed by a thermal CVD method using a low temperature oxide (LTO) which is formed at a heat temperature of equal to or lower than 500° C. and equal to or higher than 200° C. In this case, silane (SiH$_4$), disilane (Si$_2$H$_6$), or the like can be used as the silicon source gas, and oxygen (O$_2$), dinitrogen monoxide (N$_2$O), or the like can be used as the oxygen source gas. In addition, in a case where the insulating film 105a is formed after the embrittlement region 104 is formed in the single crystal semiconductor substrate 100, the insulating film 105a is preferably formed at 300° C. or lower, more preferably 200° C. or lower, so that hydrogen added into the single crystal semiconductor substrate 100 can be prevented from being released. The thickness is preferably in the range of 10 nm to 200 nm inclusive, more preferably, 50 nm to 100 nm inclusive.

The insulating film 105b is formed using a film containing nitrogen (also referred to as a nitrogen-containing layer) such as a silicon nitride film (SiNx) or a silicon nitride oxide film ((SiNxOy)(x>y)). The insulating film 105b serves as a layer to be bonded (a bonding layer) with the base substrate 110 in this embodiment. In addition, when a semiconductor layer having a single crystal structure (hereinafter referred to as a single crystal semiconductor layer) is provided over a base substrate later, the insulating film 105b also serves as a barrier layer for preventing an impurity such as sodium (Na) contained in the base substrate from diffusing into the single crystal semiconductor layer.

Since the insulating film 105b is used as a bonding layer, a surface of the insulating film 105b is preferably planarized in order to suppress defective bonding. Specifically, the insulating film 105b is formed to have an average surface roughness (Ra) of 0.5 nm or less and a root-mean-square roughness (Rms) of 0.60 nm or less, more preferably, an average surface roughness of 0.35 nm or less and a root-mean-square roughness of 0.45 nm or less. The thickness is preferably in the range of 10 nm to 200 nm inclusive, more preferably, 50 nm to 100 nm inclusive. Note that even in the case where the bonding layer used in bonding is provided on the base substrate side, it is preferably provided with the average surface roughness and the root-mean-square roughness in the above ranges.

Since hydrogen bond greatly contributes to the bonding of the insulating film 105b and the base substrate 110, the insulating film 105b is deposited so as to contain hydrogen. With the use of a silicon nitride film or a silicon nitride oxide film containing hydrogen as the insulating film 105b, it is possible to form a strong bond with the base substrate 110 such as a glass substrate by hydrogen bonding using Si—OH and N—OH bonds.

In order to form the insulating film 105b as described above, it is preferable in this embodiment that a silicon nitride film or a silicon nitride oxide film be formed by a plasma CVD method at a substrate temperature during film formation equal to or higher than room temperature and equal to or lower than 350° C., more preferably, equal to or higher than room temperature and equal to or lower than 300° C. By lowering the substrate temperature during film formation, surface roughness of the insulating film 105b to be formed can be reduced. This is because as the substrate temperature during film formation becomes higher, etching reaction on a deposition surface of a film due to radicals or the like becomes excessive and surface roughness is generated. In addition, hydrogen that is added into the single crystal semiconductor substrate 100 can be prevented from being released.

In this embodiment, film formation is preferably performed by a plasma CVD method using at least a silane gas, an ammonia gas, and a hydrogen gas. By using an ammonia gas and a hydrogen gas, the insulating film 105b containing hydrogen can be formed. Furthermore, when the substrate temperature during film formation is low, there are also advantages that dehydrogenation reaction during film formation can be suppressed and the amount of hydrogen contained in the insulating film 105b can be increased.

The insulating film 105b which is obtained by a plasma CVD method at a low substrate temperature during film formation contains a large amount of hydrogen and has a low density. Since the insulating film 105b having a low density can enhance its density by heat treatment, the thickness thereof can be decreased after the heat treatment as compared to the thickness before the heat treatment. Therefore, by bonding of the insulating film 105b having a low density with the base substrate, even when a surface on the base substrate or the surface of the insulating film 105b is uneven, the unevenness can be absorbed by the decrease of the insulating film 105b in thickness. Thus, defective bonding can be suppressed. Moreover, after the insulating film 105b is densified, by heat treatment performed at the same time as or after bonding, an element such as a transistor can be formed.

By irradiating the single crystal semiconductor substrate 100 with ions through the insulating film 102 formed by radical treatment, surface roughness of the insulating film 102 can be suppressed. Thus, even when the insulating film 105 is further deposited over the insulating film 102, the surface unevenness of the insulating film 105 is not affected and the insulating film 105 can be formed planar.

Next, a base substrate 110 is prepared (see FIG. 1B). As the base substrate 110, a substrate formed of an insulator is used. Specifically, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. In this embodiment, a case of using a glass substrate is described. With the use of a glass substrate as the base substrate 110, which is inexpensive and can be formed to have a large area, cost can be reduced as compared to the case of using a silicon wafer.

Figure 1C:
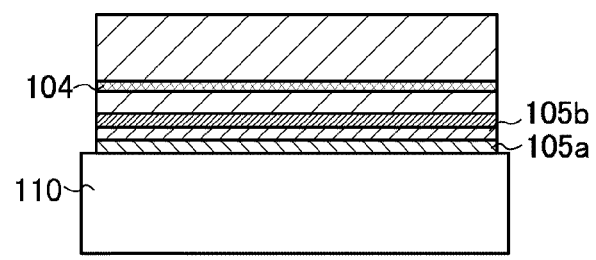

Next, the surface of the insulating film 105b and the surface of a base substrate 110 are bonded to each other so that the single crystal semiconductor substrate 100 and the base substrate 110 face to each other (see FIG. 1C).

Here, after the single crystal semiconductor substrate 100 and the base substrate 110 are bonded to each other with the insulating film 105 interposed therebetween, a pressure of 1 N/cm$^2$ to 500 N/cm$^2$, preferably about 1 N/cm$^2$ to 20 N/cm$^2$ is applied to a portion of the single crystal semiconductor substrate 100. Bonding between the insulating film 105 and the base substrate 110 begins from the portion to which pressure is applied and then the spontaneous bonding proceeds almost throughout the surface. This bonding step is performed by Van der Waals force or hydrogen bond at the normal temperature without heat treatment. Therefore, a substrate with low heat resistance temperature, such as a glass substrate, can be used as the base substrate 110. In addition, since the insulating film 105 is formed planar, a local gap (void) at the bonding surface is not likely to be generated, and the bonding strength can be increased.

Note that before the bonding of the single crystal semiconductor substrate 100 and the base substrate 110, surface treatment is preferably performed on at least either the insulating film 105 formed over the single crystal semiconductor substrate 100 or the base substrate 110.

As the surface treatment, plasma treatment, ozone treatment, megasonic cleaning, or two-fluid cleaning (a method to inject functional water such as pure water or hydrogen-containing water as well as a carrier gas such as nitrogen), or a combination thereof can be employed. In particular, after plasma treatment is performed on at least either the surface of the insulating film 105 or a surface of the base substrate 110, ozone treatment, megasonic cleaning, two-fluid cleaning, or the like can be performed on the single crystal semiconductor substrate 100 and the base substrate 110 to remove dust such as an organic matter on the process surface(s), and make the surface(s) hydrophilic. As a result, bonding strength between the insulating film 105 and the base substrate 110 can be increased. In the plasma treatment here, an RIE method, an ICP method, or atmospheric plasma is performed using an inert gas such as argon (Ar) gas, and/or a reactive gas such as an oxygen ($O_2$) gas or a nitrogen ($N_2$) gas.

After the single crystal semiconductor substrate 100 is bonded to the base substrate 110, heat treatment for increasing bonding strength between the insulating film 105 and the base substrate 110 is preferably performed. This heat treatment is performed at a temperature where a crack is not generated in the embrittlement region 104; for example, the temperature can be in a range of greater than or equal to room temperature and less than 400° C. Further, at the same time as they are heated at a temperature in this range, the insulating film 105 and the base substrate 110 may be bonded to each other. For this heat treatment, a diffusion furnace, a heating furnace such as a resistance heating furnace, a rapid thermal annealing (RTA) apparatus, a microwave heating apparatus, or the like can be used.

In general, when heat treatment is performed at the same time as or after the bonding of the insulating film 105 and the base substrate 110, dehydration reaction proceeds at the bonding interface and the bonding surfaces become close to each other to strengthen the hydrogen bonding or to form a covalent bond, resulting in strong bonding. In order to promote the dehydration reaction, moisture generated at the bonding interface by the dehydration reaction needs to be removed by heat treatment at a high temperature. That is, in a case where the temperature of the heat treatment after the bonding is low, moisture generated at the bonding interface by the dehydration reaction cannot be removed effectively; accordingly, the dehydration reaction does not proceed and the bonding strength is not increased sufficiently.

In this embodiment, even if a substrate with low heat resistance such as a glass substrate is used as the base substrate 110, the bonding strength between the insulating film 105 and the base substrate 110 can be sufficiently increased. In addition, in the case where plasma treatment is performed by applying a bias voltage before the bonding, the bonding strength between the insulating film 105 and the base substrate 110 can be increased even at a low temperature.

Next, heat treatment is performed for separation (cleave) along the embrittlement region 104 to form the single crystal semiconductor layer 112 (hereinafter referred to as a first single crystal semiconductor layer 112) over the base substrate 110 with the insulating film 102 and the insulating film 105 interposed therebetween (see FIG. 1D).

As the temperature is increased by the heat treatment, the internal pressure of microvoids formed in the embrittlement region 104 is also increased. By increasing the pressure, the microvoids in the embrittlement region 104 are changed in volume and a crack is generated in the embrittlement region 104. Thus, the single crystal semiconductor substrate 100 is cleaved (separated) along the embrittlement region 104. Since the insulating film 105 is bonded to the base substrate 110, the first single crystal semiconductor layer 112, which have been separated from the single crystal semiconductor substrate 100, is provided over the base substrate 110. Further, the temperature in the heat treatment is set so as not to exceed the strain point of the base substrate 110.

For this heat treatment, a diffusion furnace, a heating furnace such as a resistance heating furnace, a rapid thermal annealing (RTA) apparatus, a microwave heating apparatus, or the like can be used. For example, the heat treatment can be performed using an RTA apparatus at a heat temperature of greater than or equal to 550° C. and less than or equal to 730° C., for a process time of greater than or equal to 30 seconds and less than or equal to 60 minutes.

Note that without performing the above-described heat treatment for increasing the bonding strength between the base substrate 110 and the insulating film 105, a heat treatment step for increasing the bonding strength between the base substrate 110 and the insulating film 105 and a heat treatment step for separation along the embrittlement region 104 may be performed at the same time.

Figure 1D:
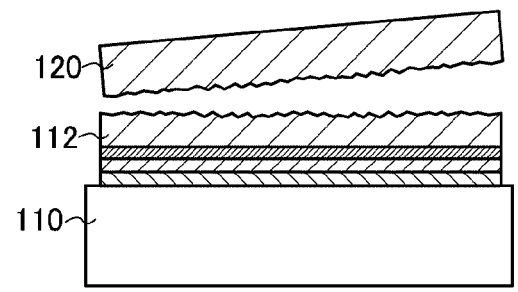

Through the above process, the first single crystal semiconductor layer 112 can be provided over the base substrate 110 with the insulating film 102 and the insulating film 105 interposed therebetween (see FIG. 1D).

In general, crystal defects and the like are formed in the first single crystal semiconductor layer 112 provided over the base substrate 110 after the separation and planarity of a surface of the first single crystal semiconductor layer 112 is deteriorated because of the formation of the embrittlement region 104 and the separation along the embrittlement region 104 (see FIG. 1D). In addition, a native oxide film can be formed on the surface of the first single crystal semiconductor layer 112. Thus, treatment for repairing the defects in the first single crystal semiconductor layer 112 or treatment for planarizing the surface may be performed. Note that the step described below for repairing the defects or planarizing the surface is not always necessary.

Treatment for repairing the defects or planarizing the surface is performed by either or both etching or/and laser beam irradiation. The etching treatment can be performed by either or both dry etching or/and wet etching. Instead of etching treatment, polishing treatment such as CMP may be performed.

As the etching treatment, for example, a reactive ion etching (RIE) method, an inductively coupled plasma (ICP) etching method, an electron cyclotron resonance (ECR) etching method, a parallel plate (capacitive coupled) etching method, a magnetron plasma etching method, a dual-frequency plasma etching method, or a helicon wave plasma etching method may be employed. In the etching, for example, a chlorine-based gas such as $Cl_2$, $BCl_3$, or $SiCl_4$; a fluorine-based gas such as $CHF_3$, $CF_4$, $C_4F_8$, $C_2F_6$, $NF_3$, or sulfur fluoride; or a boron-based gas such as HBr can be used as an etching gas. Further, an inert gas such as He, Ar, or Xe; an $O_2$ gas; or an $H_2$ gas can be used. Note that the etching treatment may be performed in plural times. Since the size or depth of defects in the first single crystal semiconductor layer 112 depends on the amount of energy or dose of ions which are added, the thickness of a surface portion of the first single crystal semiconductor layer 112 which is removed by the etching treatment may be set as appropriate depending on the thickness and surface roughness of the first single crystal semiconductor layer 112 before the etching treatment. For example, it is preferable to remove the first single crystal semiconductor layer 112 by 1 nm to 30 nm inclusive, by the etching treatment. By the etching treatment, defects formed on the surface of the first single crystal semiconductor layer 112 can be removed, and surface roughness of the first single crystal semiconductor layer 112 can be reduced.

Since a surface portion of the first single crystal semiconductor layer 112 provided over the base substrate 110 is removed by the etching, crystal defects and the like in the first single crystal semiconductor layer 112 can be removed and its surface can be made planar.

Crystal defects are formed in the first single crystal semiconductor layer 112 in the ion irradiation step for forming the embrittlement region 104. By irradiating the first single crystal semiconductor layer 112 with a laser beam from the separation surface side or the base substrate 110 side, the first single crystal semiconductor layer 112 is melted so that its crystallinity and planarity can be improved. The first single crystal semiconductor layer 112 is partially melted or completely melted by irradiation with the laser beam.

It is preferable that the first single crystal semiconductor layer 112 be partially melted by the laser beam irradiation. By partial melting of the first single crystal semiconductor layer 112, crystal growth proceeds from a solid-phase part that is not melted; accordingly, the crystal defects can be repaired without lowering the crystallinity. Note that, in this specification, partial melting refers to the state in which part (for example, an upper part) of the single crystal semiconductor layer is melted to be in a liquid-phase state, whereas the other part (for example, a lower part) thereof is kept in a solid-phase state without being melted. Note that complete melting refers to the state in which the single crystal semiconductor layer is melted down to the vicinity of the lower interface of the single crystal semiconductor layer to be in a liquid-phase state.

Scanning with the laser beam is performed while partial melting is performed by laser beam irradiation; accordingly, crystal growth proceeds from a solid-phase part that is not melted. As a result, crystal defects in the first single crystal semiconductor layer 112 are decreased and the crystallinity is improved. A part which is not melted is a single crystal and crystal orientations are aligned; thus, crystal grain boundaries are not formed, and the first single crystal semiconductor layer 112 after the laser beam irradiation can be a single crystal semiconductor layer without crystal grain boundaries. Moreover, a melted region is recrystallized by solidification, and a single crystal semiconductor which is adjacent to the melted region and which is not melted and a single crystal semiconductor which has aligned crystal orientations are formed. Thus, in the case of using single crystal silicon whose plane orientation of a main surface is (100) for the single crystal semiconductor substrate 100, the plane orientation of a main surface of the first single crystal semiconductor layer 112 is (100), and the plane orientation of a main surface of the first single crystal semiconductor layer 112 which is melted by laser beam irradiation and recrystallized is (100). Note that RTA or flash lamp irradiation may also be performed instead of laser beam irradiation.

The laser beam irradiation after the etching treatment can prevent crystal defects or contamination from being taken in the single crystal semiconductor layer. In addition, by removal of the native oxide film, surface roughness due to laser beam irradiation can be prevented.

In the above manner, an SOI substrate including the first single crystal semiconductor layer 112 formed by being separated from the single crystal semiconductor substrate 100 can be manufactured. Note that steps below may be performed after the above-described treatment for repairing crystal defects or for planarizing the surface, or may be performed without treatment for repairing crystal defects or for planarizing the surface.

Figure 3A:
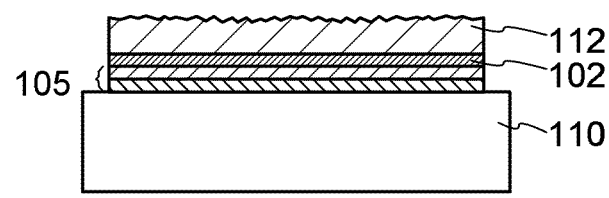
FIGS. 3A to 3D illustrate an example of a method for manufacturing an SOI substrate according to an embodiment of the present invention.
Figure 3B:
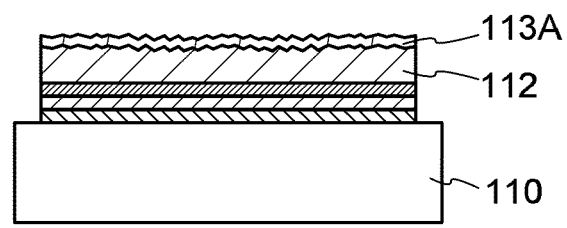

Next, a first semiconductor layer 113A is formed on the first single crystal semiconductor layer 112 (see FIG. 3B). For example, the first semiconductor layer 113A can be formed by a vapor-phase growth (vapor-phase epitaxial) method (see FIG. 3B). That is, the first semiconductor layer 113A is a semiconductor layer affected by the crystallinity of the first single crystal semiconductor layer 112. Here, a material for the first semiconductor layer 113A may be selected in accordance with the first single crystal semiconductor layer 112. For example, in a case of forming a silicon layer as the first semiconductor layer 113A, it can be formed by a plasma CVD method using a mixed gas of a silane based gas (typically silane) and a hydrogen gas as a material. In addition, the first semiconductor layer 113A is formed to a thickness of 5 nm to 100 nm inclusive, preferably about 10 nm to 50 nm inclusive.

Note that the native oxide film and the like formed on a surface of the first single crystal semiconductor layer 112 is preferably removed before the first semiconductor layer 113A is epitaxially grown, in order to prevent reduction in the crystallinity of the first semiconductor layer 113A. This is because an oxide layer on the surface of the first single crystal semiconductor layer 112 can hinder processing of the epitaxial growth that is affected by the crystallinity of the first single crystal semiconductor layer 112. Here, the oxide layer can be removed using a solution containing fluorinated acid or the like.

Figure 3C:
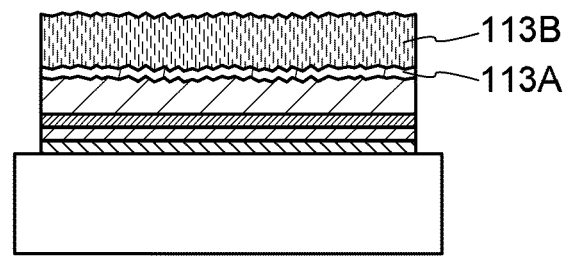

Next, a first semiconductor layer 113B is formed over the first semiconductor layer 113A (see FIG. 3C). Here, a material for the first semiconductor layer 113B may be selected in accordance with the first semiconductor layer 113A. In addition, the first semiconductor layer 113B is formed to a thickness of 200 nm or more (preferably, 400 nm or more). Also in that case, an oxide layer formed on the surface of the first semiconductor layer 113A is preferably removed in advance.

The first semiconductor layer 113B is a semiconductor layer having a lower crystallinity than the first semiconductor layer 113A. Alternatively, the first semiconductor layer 113B is a semiconductor layer having a higher hydrogen concentration (a semiconductor layer which contains more hydrogen) as compared to the first semiconductor layer 113A. For example, an amorphous semiconductor layer may be formed as such a first semiconductor layer 113B.

Although the first semiconductor layer 113B may be formed by any method, it is preferably formed under at least such a condition that the deposition rate is higher than that of the first semiconductor layer 113A. For example, in a case of forming the first semiconductor layer 113B by a plasma CVD method using a mixed gas of a silane based gas (typically silane) and a hydrogen gas as a material, the flow ratio of the hydrogen gas to the silane based gas may be from 2 to 20:1 (preferably, from 5 to 15:1). In addition, the frequency may be set at 10 MHz to 200 MHz; power, from 5 W to 50 W inclusive, the pressure in the chamber, from 10 Pa to $10^3$ Pa inclusive; the distance between electrodes (in the case of a parallel-plate type), from 15 mm to 30 mm inclusive; and the temperature of the base substrate 110, from 200° C. to 400° C. inclusive. Typically, the conditions may be set as follows: the flow rate of silane ($SiH_4$) is 25 sccm; the flow rate of hydrogen, 150 sccm; the frequency, 27 MHz; the power, 30 W; the pressure, 66.6 Pa; the distance between electrodes, 25 nm; and the temperature of the substrate, 280° C. Note that the above deposition conditions are only an example and the present invention should not be interpreted as being limited thereto. Here, an important point is forming a semiconductor layer at a high deposition rate even though the crystallinity is lower (or the hydrogen concentration is higher) as the first semiconductor layer 113B; thus, any method for forming the first semiconductor layer 113B may be used as long as the above object can be achieved.

Figure 3D:
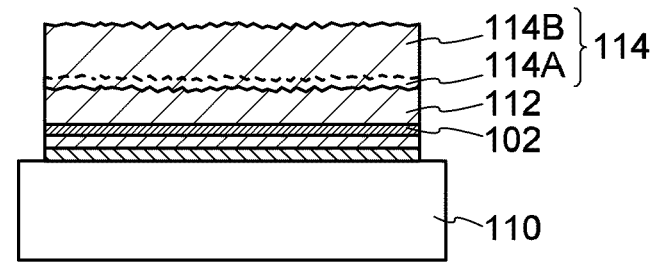

Then, heat treatment is performed and a second semiconductor layer 114 is formed by solid-phase epitaxial growth (solid-phase growth) (see FIG. 3D). Note that the first semiconductor layer 113A corresponds to a lower region 114A of the second semiconductor layer 114, and the first semiconductor layer 113B corresponds to an upper region 114B of the second semiconductor layer 114.

The above heat treatment can be performed with the use of a heat treatment apparatus such as a rapid thermal anneal (RTA) apparatus, a furnace, a millimeter wave heating apparatus, or the like. As a heating method of the heat treatment apparatus, a resistance heating method, a lamp heating method, a gas heating method, an electromagnetic wave heating method, or the like can be used. Alternatively, laser beam irradiation or thermal plasma jet irradiation may be performed.

In the above manner, a stacked-layer structure of the first single crystal semiconductor layer 112 and the second semiconductor layer 114 is formed. In terms of the deposition rate, it is not preferable to use only a vapor-phase growth method in forming the second semiconductor layer 114 thick (for example, 500 nm or more). On the other hand, in the case of using only a solid-phase growth method for forming the second semiconductor layer 114, there arises a problem that the semiconductor layer is separated due to heat treatment. This is thought to be a result from a large amount of hydrogen contained in the semiconductor layer (for example, an amorphous semiconductor layer) immediately after the film formation.

In this embodiment, after forming the first semiconductor layer 113A (a semiconductor layer having high crystallinity, a semiconductor layer in which hydrogen concentration is low) thin by vapor-phase growth, and forming the first semiconductor layer 113B (a semiconductor layer having low crystallinity, a semiconductor layer in which high hydrogen concentration is high) thick, the second semiconductor layer 114 is formed by solid-phase growth. In this manner, the deposition rate is ensured and at the same time, the problem that the semiconductor layer is separated can be solved. In other words, a single crystal semiconductor layer having a predetermined thickness can be formed with high productivity and a high yield.

It is likely that the problem that the semiconductor layer is separated can be reduced by forming a stacked-layer structure of a semiconductor layer having high crystallinity and a semiconductor layer having low crystallinity over a single crystal semiconductor layer and then performing solid-phase growth because the difference in crystallinity between the adjacent layers is reduced and the bonding between atoms at the interface is strengthened, and thus the adhesion is increased.

In view of the reason described above, the present invention should not be interpreted as being limited to this embodiment in which a semiconductor layer having high crystallinity (the first semiconductor layer 113A) is formed between a single crystal semiconductor layer (the first single crystal semiconductor layer 112) and a semiconductor layer having low crystallinity (the first semiconductor layer 113B). That is, a plurality of semiconductor layers having different crystallinity may be provided between the single crystal semiconductor layer and the semiconductor layer having low crystallinity. For example, a semiconductor layer having high crystallinity, a semiconductor layer having slightly higher crystallinity, and a semiconductor layer having low crystallinity can be formed over the single crystal semiconductor layer in this order. With this structure, adhesion can be further improved.

In the above manner, a semiconductor substrate having a thick single crystal semiconductor layer can be manufactured. Note that a surface of the second semiconductor layer 114 is greatly affected by a surface of the first single crystal semiconductor layer 112 because planarization treatment is not performed on the surface of the first single crystal semiconductor layer 112 in this embodiment. Thus, the surface of the second semiconductor layer 114 may be planarized if necessary.

Further, the present invention should not be interpreted as being limited to this embodiment in which a method for forming the first single crystal semiconductor layer 112 and the second semiconductor layer 114 are formed over the base substrate 110 with the insulating films 102 and 105 interposed therebetween. For example, a layer having a variety of functions (hereinafter referred to as a functional layer) may be formed in a lower portion of the first single crystal semiconductor layer 112. The functional layer can be a layer including a conductive material, a layer including an impurity element (a semiconductor layer including an impurity element), or the like, for example.

(Embodiment 2)

In this embodiment, a method for manufacturing an SOI substrate which is different from that described in Embodiment 1 is described with reference to FIGS. 4A1 to 4D. Hereinafter, portions different from those in Embodiment 1 are described. Accordingly, a detailed description of portions similar to those in Embodiment 1 is omitted.

In this embodiment, preparation of a single crystal semiconductor substrate 100 (FIG. 4A1), a step for forming an insulating film 102 (FIG. 4A2), and an ion irradiation step (FIG. 4A3) can be performed in a manner similar to the preparation of the single crystal semiconductor substrate 100 (FIG. 1A1), the step for forming the insulating film 102 (FIG. 1A2), and the ion irradiation step (FIG. 1A3), in Embodiment 1, respectively.

Then, the insulating film 102 formed on the single crystal semiconductor substrate 100 is removed (see FIG. 4A4). Wet etching can be used for removing the insulating film 102. Alternatively, dry etching or chemical mechanical polishing (CMP) can be used. A portion in which planarity is damaged by the ion irradiation step is removed by removing the insulating film 102 to planarize a surface of the semiconductor substrate. In addition, a contaminant in the vicinity of the surface of the insulating film 102 can also be removed. Therefore, an influence of an impurity on an SOI substrate can be reduced.

Then, an insulating film 105 is formed over the single crystal semiconductor substrate 100 from which the insulating film 102 is removed, in a manner similar to that of Embodiment 1 (see FIG. 4A5). Although a silicon oxide film is formed as a single layer in FIG. 4A5, the present invention not limited thereto and a stacked-layer structure of two or more layers may also be used.

Next, in a manner similar to that of Embodiment 1, a base substrate 110 is prepared (see FIG. 4B1), and a nitrogen-containing layer 111, for example, an insulating film containing nitrogen such as a silicon nitride film (SiNx) or a silicon nitride oxide film ((SiNxOy)(x>y)) is formed on the base substrate 110 (see FIG. 4B2).

The nitrogen-containing layer 111 serves as a layer to be bonded (a bonding layer) to the insulating film 105 formed over the single crystal semiconductor substrate 100 in this embodiment. In addition, when a single crystal semiconductor layer having a single crystal structure is provided over the base substrate 110 later, the nitrogen-containing layer 111 also serves as a barrier layer for preventing an impurity such as sodium (Na) contained in the base substrate 110 from diffusing into a single crystal semiconductor layer.

Since the nitrogen-containing layer 111 is used as a bonding layer, a surface of the nitrogen-containing layer 111 is preferably planarized in order to suppress defective bonding. Specifically, the nitrogen-containing layer 111 is formed to have an average surface roughness (Ra) of 0.5 nm or less and a root-mean-square roughness (Rms) of 0.60 nm or less, more preferably an average surface roughness of 0.35 nm or less and a root-mean-square roughness of 0.45 nm or less. The thickness is preferably in the range of 10 nm to 200 nm inclusive, more preferably, 50 nm to 100 nm inclusive.

Here, surface treatment is preferably performed on at least either the insulating film 105 formed over the single crystal semiconductor substrate 100 or nitrogen-containing layer 111 on the base substrate 110. As the surface treatment, plasma treatment, ozone treatment, megasonic cleaning, or two-fluid cleaning (a method to inject functional water such as pure water or hydrogen-containing water as well as a carrier gas such as nitrogen), or a combination thereof can be employed. In particular, after plasma treatment is performed on at least either a surface of the insulating film 105 or a surface of the base substrate 110, ozone treatment, megasonic cleaning, two-fluid cleaning or the like can be performed on the single crystal semiconductor substrate 100 and the base substrate 110 to remove dust such as an organic matter on the surface to be processed, and make the surface(s) hydrophilic. As a result, bonding strength between the insulating film 105 and the base substrate 110 can be enhanced. In the plasma treatment here, an RIE method, an ICP method, or atmospheric plasma is performed using an inert gas such as argon (Ar) gas, and/or a reactive gas such as oxygen ($O_2$) gas or nitrogen ($N_2$) gas.

Next, a surface of the insulating film 105 and a surface of the nitrogen-containing layer 111 are bonded to each other so that the single crystal semiconductor substrate 100 and the base substrate 110 face to each other (see FIG. 4C). Then, by heat treatment, the single crystal semiconductor substrate 100 is separated along an embrittlement region 104 to form the first single crystal semiconductor layer 112 over the base substrate 110 with the insulating film 105 and the nitrogen-containing layer 111 interposed therebetween (see FIG. 4D). A detailed description of steps illustrated in FIGS. 4C and 4D is omitted because the steps can be performed in a manner similar to the steps illustrated in FIGS. 1C and 1D.

A detailed description of treatment of the first single crystal semiconductor layer 112 that is separated from the single crystal semiconductor substrate 100 is omitted because the treatment can be performed in a manner similar to the ones illustrated in FIGS. 3A to 3D in Embodiment 1.

Through the above process, an SOI substrate provided with the first single crystal semiconductor layer 112 over the base substrate 110 with the insulating film 105 and the nitrogen-containing layer 111 interposed therebetween can be manufactured. By using a manufacturing method described in this embodiment, in which the insulating film 105 is formed after the removal of the insulating film 102, the surface of the insulating film 105 can be formed to be planar even though a surface of the insulating film 102 becomes rough by ion irradiation. In addition, in a case where the above-described hydrogen ion irradiation is performed using an ion doping apparatus, an impurity such as a heavy metal element can remain, in rare cases, in the insulating film 102. However, by removing the insulating film 102, the impurity can also be removed together with the insulating film 102. Since the insulating film 105 can be formed planar, a local gap at the surface to be bonded with the nitrogen-containing layer 111 is not easily generated, and the bonding strength can be increased. In addition, by forming the nitrogen-containing layer 111 over the base substrate 110, diffusion of an impurity into the first single crystal semiconductor layer 112 to be provided over the base substrate 110 is suppressed, and an SOI substrate in which the base substrate 110 and the first single crystal semiconductor layer 112 is strongly bonded can be formed.

Note that the method for manufacturing an SOI substrate described in this embodiment can be implemented in combination with a manufacturing method in any of the other embodiments in this specification, as appropriate.

Embodiment 3)

In this embodiment, a processing method of a single crystal semiconductor substrate in a case where a stacked-layer structure of an impurity semiconductor layer (a first impurity semiconductor layer) and a conductive layer is formed is described with reference to FIGS. 5A to 5G Note that a detailed description of the same portions as those in Embodiments 1 and 2 is omitted.

Figure 5A:
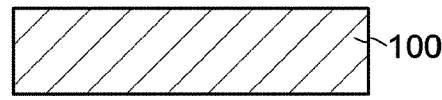
FIGS. 5A to 5G illustrate an example of a method for manufacturing an SOI substrate according to an embodiment of the present invention.
Figure 5B:
Figure 5C:
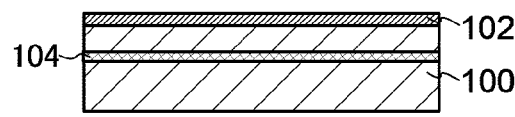

First, a single crystal semiconductor substrate 100 is prepared (see FIG. 5A). After the single crystal semiconductor substrate 100 is cleaned, an insulating film 102 is formed over a surface of the single crystal semiconductor substrate 100 (see FIG. 5B). Then, the single crystal semiconductor substrate 100 is irradiated with ions through the insulating film 102 to form an embrittlement region 104 in a region at a predetermined depth (see FIG. 5C). A detailed description of steps illustrated in FIGS. 5A and 5C is omitted because the steps can be performed in a manner similar to the steps illustrated in FIGS. 1A1 to 1A3.

Figure 5D:
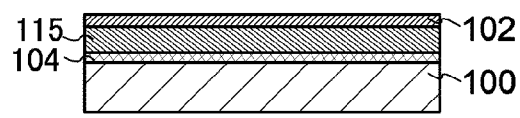

After the formation of the embrittlement region 104 in the single crystal semiconductor substrate 100, the single crystal semiconductor substrate 100 is irradiated with an impurity element imparting one conductivity type to form a first impurity semiconductor layer 115 (FIG. 5D). Note that the impurity element imparting one conductivity type is added through the insulating film 102 into the single crystal semiconductor substrate 100 since the insulating film 102 is formed over the single crystal semiconductor substrate 100. Here, the thickness of the first impurity semiconductor layer 115 is from 30 nm to 300 nm inclusive, preferably, from about 50 nm to 100 nm inclusive.

For example, phosphorus or the like is used as the above-described impurity element imparting one conductivity type and then the first impurity semiconductor layer 115 of n-type can be formed. Obviously, boron or the like may also be used for forming the first impurity semiconductor layer 115 of p-type. Note that a case where the first impurity semiconductor layer 115 is formed by ion beam irradiation is described here; however, the present invention should not be interpreted as being limited to this. For example, a thermal diffusion method may also be employed to form the first impurity semiconductor layer 115. Note that the thermal diffusion method needs to be performed before the formation of the embrittlement region 104 because the thermal diffusion method includes treatment at a high temperature, which is about 900° C. or more. Alternatively, a single crystal semiconductor substrate to which an impurity element imparting one conductivity type is added in advance can be used so as to omit the addition of the impurity element described above.

Note that the concentration of the impurity element is preferably, but not particularly limited to, $1 \times 10^{19}$ atoms/cm$^3$ to $5 \times 10^{21}$ atoms/cm$^3$ inclusive, for example. The first impurity semiconductor layer 115 formed by the above method is a single crystal semiconductor.

Figure 5E:
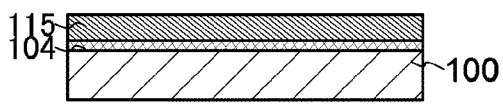
Figure 5F:
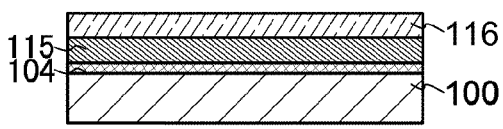

After the first impurity semiconductor layer 115 is formed, the insulating film 102 is removed (see FIG. 5E). After the insulating film 102 is removed, a conductive layer 116 is formed (see FIG. 5F). The conductive layer 116 needs to be resistant to heat treatment in a subsequent step. Thus, a refractory metal material such as titanium, molybdenum, tungsten, tantalum, chromium, or nickel is preferably used for the conductive layer 116. A stacked structure of the above-described metal material and a nitride of the metal material may also be used. For example, a stacked-structure of a titanium nitride layer and a titanium layer, a stacked structure of a tantalum nitride layer and a tantalum layer, a stacked structure of a tungsten nitride layer and a tungsten layer, or the like can be used. Note that an evaporation method or a sputtering method can be used to form the conductive layer 116. In a case of being used as an electrode (or a wiring), the conductive layer 116 preferably has a thickness of 100 nm or more.

Figure 5G:
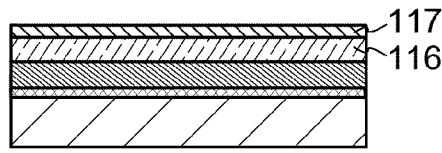

Next, an insulating layer 117 is formed over the conductive layer 116 (see FIG. 5G). A surface of the insulating layer 117 preferably has high planarity since the insulating layer 116 is a layer to be used in bonding. The insulating layer 117 can be, for example, a silicon oxide layer formed by a chemical vapor deposition method using an organosilane gas. Alternatively, the insulating layer 117 may be a silicon nitride layer.

Note that FIGS. 5A to 5G illustrate the steps as following: the insulating film 102 is formed on the single crystal semiconductor substrate 100; ion irradiation is performed to form the embrittlement region 104; the impurity element imparting one conductivity type is added into the single crystal semiconductor substrate 100 to form the first impurity semiconductor layer 115; the insulating film 102 is removed; and the conductive layer 116 and the insulating layer 117 are formed. However, the present invention is not limited thereto.

For example, any of the methods described below can also be employed.

(2) A protective layer is formed on one surface of a single crystal semiconductor substrate, a first impurity semiconductor layer is formed on the side of the one surface of the single crystal semiconductor substrate by irradiating the single crystal semiconductor substrate with an impurity element imparting one conductivity type through the surface of the protective layer, and then, an embrittlement region is formed in a region at a predetermined depth of the single crystal semiconductor substrate by irradiating the single crystal semiconductor substrate with ions through a surface of the protective layer. After removing the protective layer, a first electrode is formed over the first impurity semiconductor layer and then an insulating layer is formed over the first electrode.

(3) A first electrode is formed on one surface of a single crystal semiconductor substrate. A first impurity semiconductor layer is formed on the side of the one surface of the single crystal semiconductor substrate by irradiating the single crystal semiconductor substrate with an impurity element imparting one conductivity type through a surface of the first electrode. After an embrittlement region is formed in a region at a predetermined depth of the single crystal semiconductor substrate by irradiating the single crystal semiconductor substrate with ions through the surface of the first electrode, an insulating layer is formed on the first electrode.

(4) A first electrode is formed on one surface of a single crystal semiconductor substrate. An embrittlement region is formed in a region at a predetermined depth of the single crystal semiconductor substrate by irradiating the single crystal semiconductor substrate with ions through a surface of the first electrode. Further, a first impurity semiconductor layer is formed on the side of the one surface of the single crystal semiconductor substrate by irradiating the single crystal semiconductor substrate with an impurity element imparting one conductivity type through the surface of the first electrode. Then, an insulating layer is formed on the first electrode.

In the above manner, a single crystal semiconductor substrate having a stacked-layer structure of an impurity semiconductor layer (a first impurity semiconductor layer) and a conductive layer is manufactured.

Next, a structure of a power MOSFET is described as an example of a semiconductor device according to an embodiment of the present invention with reference to FIGS. 6A to 6F, FIGS. 7A to 7C, FIGS. 8A to 8C, and FIGS. 9A and 9B.

Figure 6A:
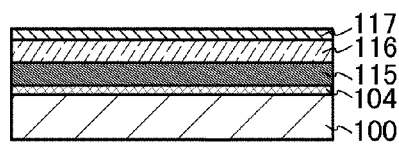
FIGS. 6A to 6F illustrate an example of a method for manufacturing an SOI substrate according to an embodiment of the present invention.

First, a single crystal semiconductor substrate 100 is prepared (see FIG. 6A). The single crystal semiconductor substrate 100 prepared here is provided with an embrittlement region 104, an impurity semiconductor layer 115, a conductive layer 116, and an insulating layer 117.

Figure 6B:
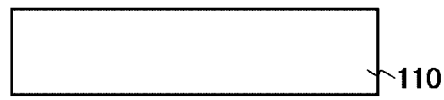

Then, a base substrate 110 is prepared (see FIG. 6B). For details about the base substrate 110, refer to Embodiment 1.

Figure 6C:
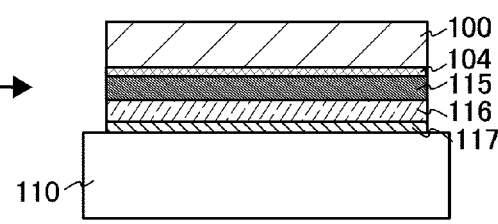

Then, the above-described base substrate 110 and the single crystal semiconductor substrate 100 are bonded to each other (see FIG. 6C). Specifically, after cleaning the surfaces of the base substrate 110 and the insulating layer 117 by a method such as ultrasonic cleaning, the surface of the base substrate 110 and the surface of the insulating layer 117 are disposed to be in contact with each other. Then, pressure treatment is performed so as to bond the surface of the base substrate 110 and the surface of the insulating layer 117. For other details, refer to Embodiment 1.

Figure 6D:
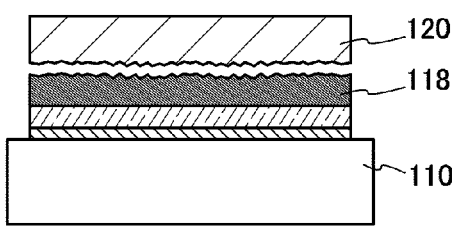

Next, the single crystal semiconductor substrate 100 is separated into an impurity semiconductor layer 118 and a single crystal semiconductor substrate 120 along the embrittlement region 104 (see FIG. 6D). The single crystal semiconductor substrate 100 is separated by heat treatment. For a detailed description thereof, Embodiment 1 can be referred to. Note that the thickness of the first impurity semiconductor layer 118 almost corresponds to the depth of the embrittlement region 104, which is 500 nm or less, preferably 400 nm or less, and more preferably 50 nm to 300 nm inclusive.

Figure 6E:
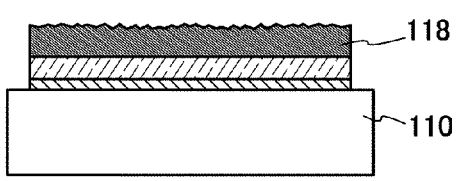

On a surface of the impurity semiconductor layer 118 formed as described above, defects due to the separation step or the ion irradiation step exist, and planarity of the surface is damaged (see FIG. 6E). Thus, in this embodiment, treatment for repairing the defects or planarizing the surface is performed on the first impurity semiconductor layer 118. Note that the treatment for repairing the defects or planarizing the surface can be omitted as appropriate if unnecessary.

As the defect repair treatment or the surface planarization treatment, any one of etching treatment and laser beam irradiation, or a combination thereof can be performed, for example. By irradiating the first impurity semiconductor layer 118 with a laser beam from the above, the upper portion of the first impurity semiconductor layer 118 is melted and then cooled and solidified so that defects can be repaired and planarity of the surface can be improved. When laser beam irradiation is performed, heat treatment may be performed within an allowable temperature limit of the base substrate. By heating the base substrate, defects can be effectively reduced. Note that since the defect repair treatment and the surface planarization treatment are similar to those described in Embodiment 1, a detailed description thereof is omitted.

Note that the first impurity semiconductor layer 118 is partially melted by the laser beam irradiation described above. If the first impurity semiconductor layer 118 is completely melted, a possibility that the crystallinity is decreased by microcrystallization due to disordered nucleation after the first impurity semiconductor layer 118 becomes in a liquid-phase state is increased. On the contrary, by partial melting, crystal growth proceeds from a solid-phase part, which is not melted. Accordingly, defects in the semiconductor layer can be reduced. Note that complete melting refers to the state in which the first impurity semiconductor layer 118 is melted down to the vicinity of the lower interface of the first single crystal semiconductor layer 118 to be in a liquid-phase state. On the other hand, partial melting refers to the state in which an upper part of the first impurity semiconductor layer 118 is melted to be in a liquid-phase state, whereas a lower part thereof is kept in a solid-phase state without being melted. For other conditions or the like, refer to Embodiment 1.

Figure 6F:
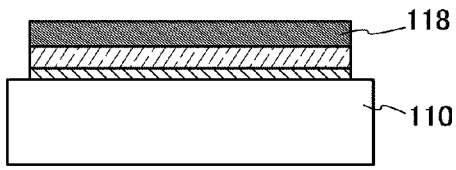

In the above manner, the semiconductor substrate having the first impurity semiconductor layer 118 in which defects are repaired and the surface is planarized can be manufactured (see FIG. 6F).

Figure 7A:
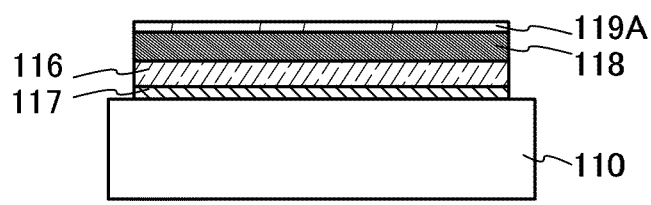
FIGS. 7A to 7C illustrate an example of a method for manufacturing an SOI substrate according to an embodiment of the present invention.

Next, a first semiconductor layer 119A is formed by epitaxial growth (vapor-phase growth, vapor-phase epitaxial growth) on the first impurity semiconductor layer 118 (see FIG. 7A). That is, the first semiconductor layer 119A is a semiconductor layer affected by the crystallinity of the first impurity semiconductor layer 118. Here, a material for the first semiconductor layer 119A may be selected in accordance with the first impurity semiconductor layer 118. For example, in a case of forming a silicon layer as the first semiconductor layer 119A, it can be formed by a plasma CVD method using a mixed gas of a silane based gas (typically silane) and a hydrogen gas as a material. Note that an impurity element imparting the same conductivity type is preferably added to the above material gas as the first impurity semiconductor layer 118. Obviously, the impurity element may be added after forming the first semiconductor layer 119A. The impurity concentration in the first semiconductor layer 119A is preferably, but not particularly limited to, lower than that in the first impurity semiconductor layer 118, which is $1 \times 10^{15}$ atoms/cm$^3$ to $1 \times 10^{19}$ atoms/cm$^3$ inclusive, for example. In addition, the first semiconductor layer 119A is formed to a thickness of 5 nm to 100 nm inclusive, preferably, about 10 nm to 50 nm inclusive.

The above material gas is a mixed gas in which a flow ratio of hydrogen to a silane based gas is 50 or more:1 (preferably, 100 or more:1). For example, a mixture of 4 sccm of silane (SiH$_4$) and 400 sccm of hydrogen may be used. By increasing a flow rate of hydrogen, a semiconductor layer with higher crystallinity can be formed. Accordingly, hydrogen content in the semiconductor layer can be reduced. For detailed conditions or the like, refer to Embodiment 1.

Figure 7B:
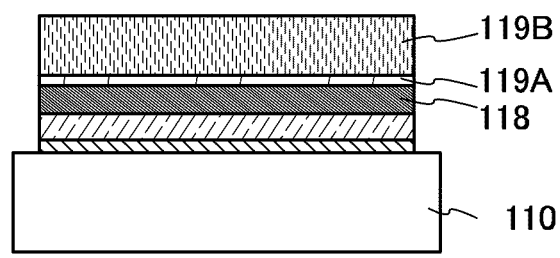

Next, a first semiconductor layer 119B is formed on the first semiconductor layer 119A (see FIG. 7B). Here, a material for the first semiconductor layer 119B may be selected in accordance with the first semiconductor layer 119A. In addition, the same impurity element is added to the first semiconductor layer 119B as the first semiconductor layer 119A. The concentration of the impurity element is preferably in the same level as that in the first semiconductor layer 119A. In addition, the first semiconductor layer 119B is formed to a thickness of 200 nm or more (preferably, 400 nm or more).

The first semiconductor layer 119B is a semiconductor layer having a lower crystallinity than the first semiconductor layer 119A. Alternatively, the first semiconductor layer 119B is a semiconductor layer having a higher hydrogen concentration (a semiconductor layer which contains more hydrogen) as compared to the first semiconductor layer 119A. For example, an amorphous semiconductor layer may be formed as such a first semiconductor layer 119B. For details, refer to Embodiment 1.

Figure 7C:
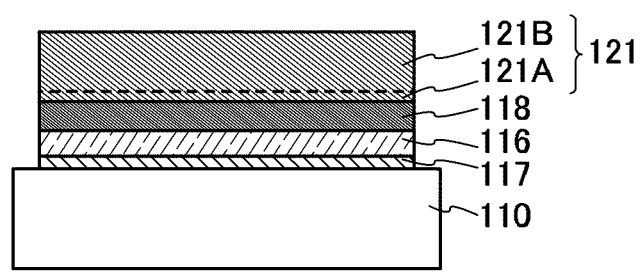

Then, heat treatment is performed and a second impurity semiconductor layer 121 is formed by solid-phase epitaxial growth (solid-phase growth) (see FIG. 7C). Note that the first semiconductor layer 119A corresponds to a lower region 121A of the second impurity semiconductor layer 121, and the first semiconductor layer 119B corresponds to an upper region 121B of the second impurity semiconductor layer 121. In addition, the second impurity semiconductor layer 121 is a single crystal semiconductor. For details on heat treatment, refer to Embodiment 1.

In the above manner, a stacked-layer structure of the first impurity semiconductor layer 118 and the second impurity layer 121 is formed. In terms of the deposition rate, it is not preferable to use only a vapor-phase growth method in forming the second impurity semiconductor layer 121 thick (for example, 500 nm or more). On the other hand, in the case of using only a solid-phase growth method for forming the second impurity semiconductor layer 121, there arises a problem that the semiconductor layer is separated due to heat treatment. This is thought to be a result from a large amount of hydrogen contained in the semiconductor layer (for example, an amorphous semiconductor layer) immediately after the film formation.

In this embodiment, after forming the first semiconductor layer 119A (a semiconductor layer having high crystallinity, a semiconductor layer in which hydrogen concentration is low) thin by vapor-phase growth, and forming the first semiconductor layer 119B (a semiconductor layer having low crystallinity, a semiconductor layer in which hydrogen concentration is high) thick, the second impurity semiconductor layer 121 is formed by solid-phase growth. In this manner, the deposition rate is ensured and at the same time, the problem that the semiconductor layer is separated can be solved. In other words, an impurity semiconductor layer (an impurity semiconductor layer of single crystals) having a predetermined thickness can be formed with high productivity and a high yield.

Figure 8A:
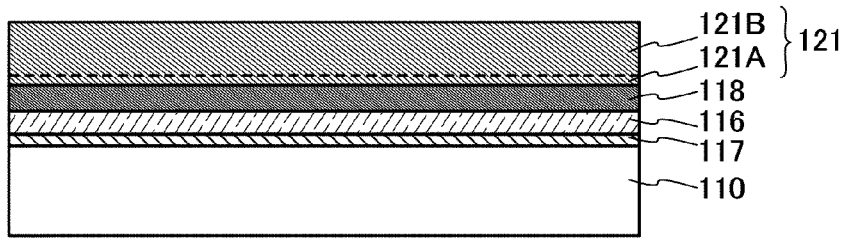
FIGS. 8A to 8C illustrate an example of a semiconductor device using an SOI substrate according to an embodiment of the present invention.

Next, a semiconductor substrate illustrated in FIG. 7C is prepared (see FIG. 8A). The semiconductor substrate includes a structure in which an insulating layer 117, a conductive layer 116, a first impurity semiconductor layer 118, a second impurity semiconductor layer 121 are stacked in this order over a base substrate 110. The thickness of the second impurity semiconductor layer 121 can be changed in accordance with a withstand voltage required for an element as appropriate; for example, the thickness can be 1 μm or more. In addition, the impurity concentration in the second impurity semiconductor layer 121 is preferably lower than that in the first impurity semiconductor layer 118.

Note that, in this embodiment, shows a case where the conductive layer 116 is provided on the entire lower surface of the first impurity semiconductor layer 118; however, the present invention is not limited to this, and the conductive layer 116 may be provided selectively. In an power MOSFET described in this embodiment, the conductive layer 116 serves as a drain electrode layer (or a source electrode layer). In addition, the first impurity semiconductor layer 118 serves as a drain region (or a source region).

Figure 8B:
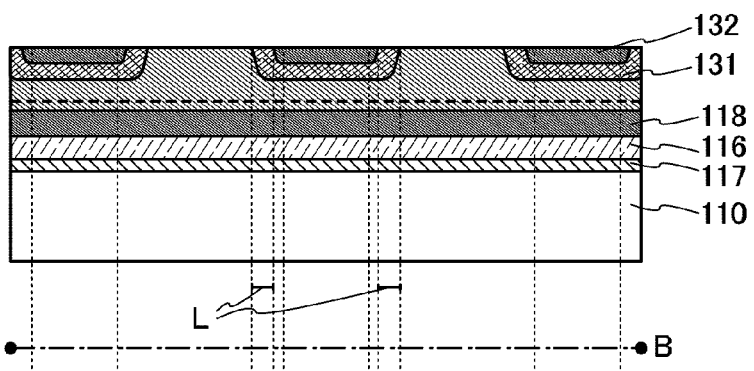

Next, an impurity element imparting p-type conductivity (for example, boron) and an impurity element imparting n-type conductivity (for example, phosphorus) are selectively added to the second impurity semiconductor layer 121 to form a first region 131 having the opposite conductivity type to the second impurity semiconductor layer 121 and a second region 132 having the same conductivity type as the second impurity semiconductor layer 121 (see FIG. 8B). Here, part of the first region 131 serves as a channel formation region later, the second region 132 serves as a source region (or a drain region) later. In addition, the impurity concentration in the second region 132 is higher than that in the second impurity semiconductor layer 121.

Figure 8C:
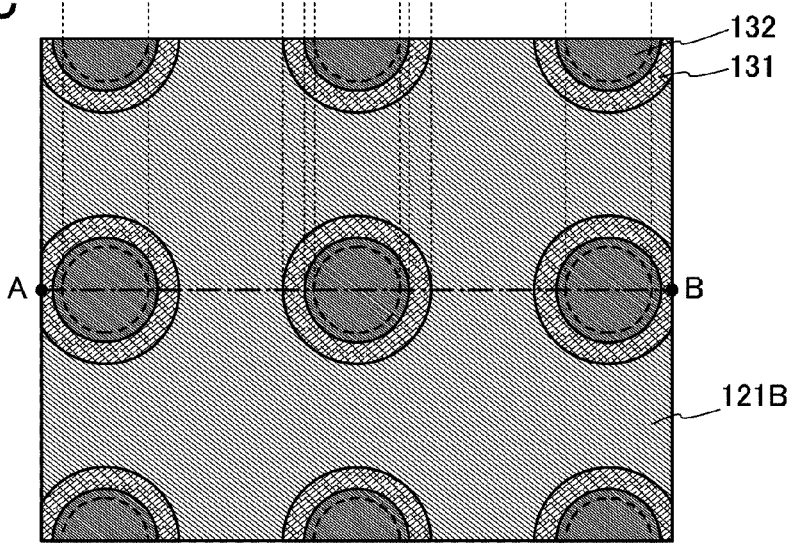

FIG. 8C is a plan view of FIG. 8B. FIG. 8B corresponds to a cross section of FIG. 8C taken along line A-B. In this embodiment, the first region 131 and the second region 132 are circular (see FIG. 8C); however, the present invention is not limited to this. A rectangular shape or other shapes can be used. By forming the first region 131 and the second region 132 to have a circular shape as described in this embodiment, the channel length L can be uniform. Accordingly, the concentration of electric field in the channel formation region can be alleviated, resulting in a higher voltage resistance of the transistor. In addition, the conductive layer 116 has an effect to enhance the waste heat efficiency of the transistor through which high current flows.

After forming the first region 131 and the second region 132, a gate insulating layer 133 is formed over the second impurity semiconductor layer 121, and a gate electrode layer 134 is selectively formed over the gate insulating layer 133. Then, an insulating layer 135 is formed so as to cover the gate electrode layer 134 (see FIG. 9A). It is preferable to form the gate electrode layer 134 so that at least part thereof overlaps with the second region 132. Thus, the concentration of electric field is alleviated, resulting in an even higher voltage resistance.

The gate insulating layer 133 can be formed using silicon oxide, silicon oxynitride, silicon nitride oxide, silicon nitride, hafnium oxide, aluminum oxide, tantalum oxide, or the like. A formation method of the gate insulating layer 133 may be a plasma CVD method, a sputtering method, a method for oxidation or nitridation by high-density plasma treatment, or the like. The insulating layer 135 can be formed in a manner similar to the gate insulating layer 133; however, the material of the insulating layer 135 can be different from that of the gate insulating layer 133. For example, an insulating material including an organic material or the like can be used.

The gate electrode layer 134 can be formed in a manner similar to the conductive layer 116. That is, a metal material such as titanium, molybdenum, tungsten, tantalum, chromium, nickel, aluminum, or copper is preferably used for the gate electrode layer 134. Alternatively, a stacked structure of the above metal material and nitride of the metal material may be applied.

Figure 9A:
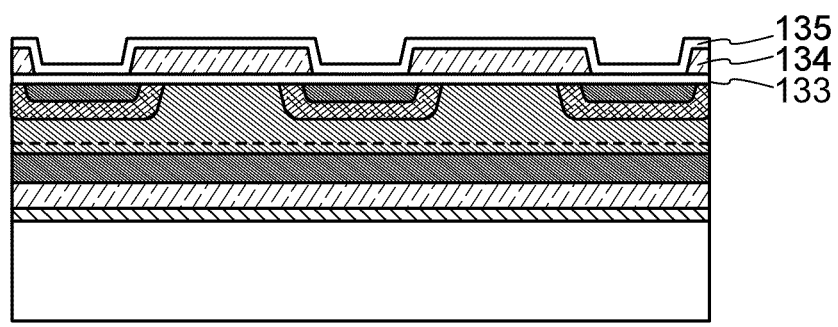
FIGS. 9A and 9B illustrate an example of a semiconductor device using an SOI substrate according to an embodiment of the present invention.
Figure 9B:
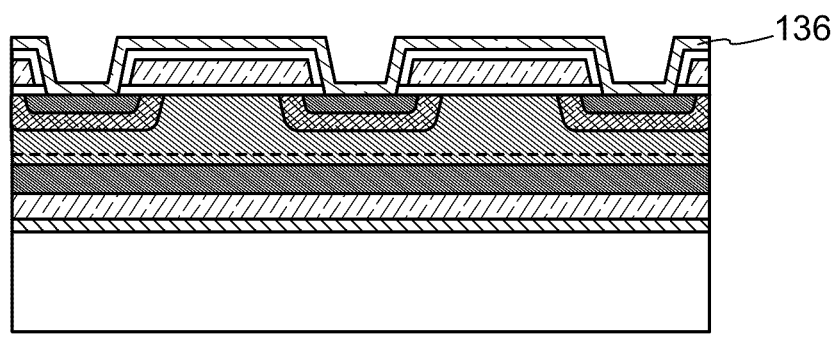

Then, after openings are formed in the insulating layer 135 and the gate insulating layer 133, a conductive layer 136 electrically connected to the second region 132 is formed (see FIG. 9B). Note that the conductive layer 136 serves as a source wiring (or a drain wiring).

The openings in the insulating layer 135 and the gate insulating layer 133 can be formed by selective etching with the use of a mask. The conductive layer 136 may be formed in a manner similar to the conductive layer 116 and the gate electrode layer 134.

In the above manner, a so-called power MOSFET can be manufactured.

Note that positions or connections of the layers are not limited to the structure illustrated in FIG. 9B. For example, part of the gate electrode layer 134 and the conductive layer 116 can be electrically connected to each other so that the part of the gate electrode layer 134 can serve as a wiring of the conductive layer 116.

This embodiment can be implemented in combination with any of the other embodiments as appropriate.

(Embodiment 4)

Next, an example of a method for manufacturing a photoelectric conversion device according to this embodiment is described with reference to FIGS. 10A to 10D, FIG. 11A to 11C, FIG. 12 and FIG. 13. Note that, in this embodiment, a case using a semiconductor substrate manufactured by the method described in Embodiments 1 to 3 is described; however, the present invention should not be interpreted as being limited to this.

Figure 10A:
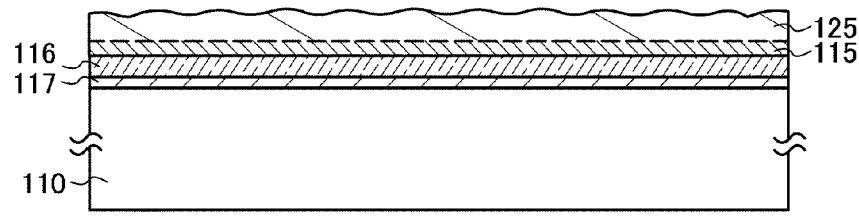
FIGS. 10A to 10D are cross-sectional views illustrating an example of a method for manufacturing a photoelectric conversion device using an SOI substrate according to an embodiment of the present invention.

First, a semiconductor substrate used in this embodiment is described (see FIG. 10A). The semiconductor substrate includes a structure in which an insulating layer 117, a conductive layer 116 (hereinafter referred to as a first conductive layer 116), a first impurity semiconductor layer 115, a first single crystal semiconductor layer 125 are stacked in this order over a base substrate 110.

The total thickness of the first impurity semiconductor layer 115 and the first single crystal semiconductor layer 125 almost corresponds to the depth of the embrittlement region 104, which is 500 nm or less, preferably 400 nm or less, and more preferably 50 nm to 300 nm inclusive. In addition, the thickness of the first impurity semiconductor layer 115 is 30 nm to 300 nm inclusive, preferably 50 nm to 100 nm inclusive. Thus, the depth of the embrittlement region 104 may be determined so that the first impurity semiconductor layer 115 and the first single crystal semiconductor layer 125 are formed over the base substrate 110 after separating the single crystal semiconductor substrate 100.

The first impurity semiconductor layer 115 formed by the method shown in Embodiment 4 is disposed on the opposite side to the light incident side. In a case of using a p-type substrate as the single crystal semiconductor substrate 100, the first impurity semiconductor layer 115 is a high-concentration p-type region. For this reason, the high-concentration p-type region and a low-concentration p-type region are disposed in this order on the opposite side to the light incident side to form a back surface field (BSF). That is, electrons cannot enter the high-concentration p-type region and thus recombination of carriers generated by photoexcitation can be reduced.

Figure 10B:
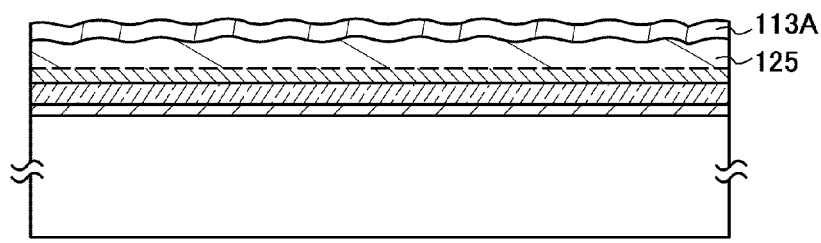
Figure 10C:
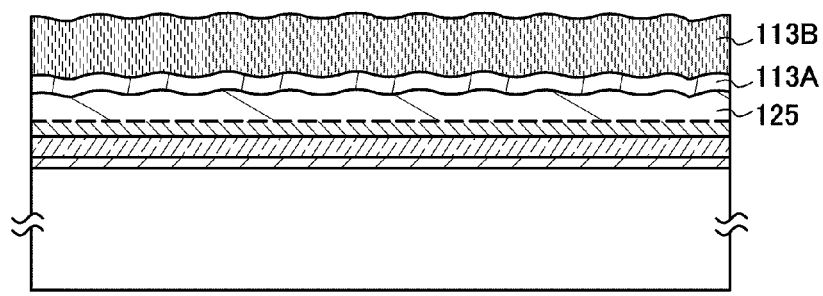

Next, a first semiconductor layer 113A is formed on the first single crystal semiconductor layer 125 (see FIG. 10B). For example, the first semiconductor layer 113A can be formed by a vapor-phase growth (vapor-phase epitaxial) method (see FIG. 10B). In this case, the first semiconductor layer 113A is a semiconductor layer affected by the crystallinity of the first single crystal semiconductor layer 125. Next, a second semiconductor layer 113B is formed on the first semiconductor layer 113A (see FIG. 10C). Here, a material for the first semiconductor layer 113B may be selected in accordance with the first semiconductor layer 113A. Then, heat treatment is performed and a second single crystal semiconductor layer 114 is formed by solid-phase growth (solid-phase epitaxial growth) (see FIG. 10D). Note that the first semiconductor layer 113A corresponds to a lower region 114A of the second single crystal semiconductor layer 114, and the first semiconductor layer 113B corresponds to an upper region 114B of the first single crystal semiconductor layer 112.

Figure 10D:
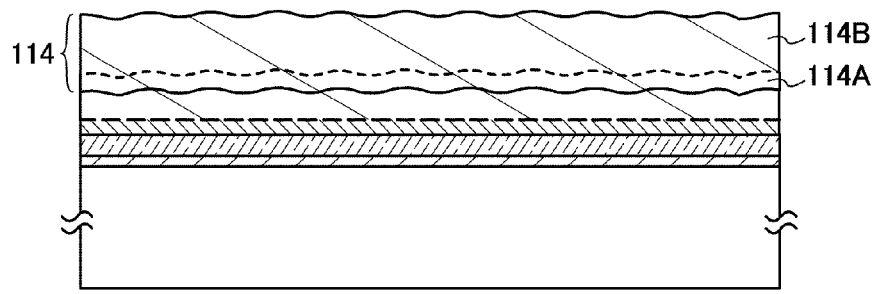

A detailed description of steps illustrated in FIGS. 10B and 10D is omitted because the steps can be performed in a manner similar to the steps described in Embodiment 1 and illustrated in FIGS. 3A to 3D.

In the above manner, a stacked-layer structure of the first single crystal semiconductor layer 125 and the second single crystal semiconductor layer 114 is formed. Here, in consideration of photoelectric conversion efficiency, a photoelectric conversion device 150 (see FIG. 12) should have a single crystal semiconductor layer with a thickness of 800 nm or more. Thus, for example, in a case where the thickness of the first single crystal semiconductor layer 125 is 300 nm, the thickness of the second single crystal semiconductor layer 114 is preferably at least 500 nm or more. In terms of the deposition rate, it is not preferable to use only a vapor-phase epitaxial growth method in forming the second single crystal semiconductor layer 114 thick, which is 500 nm or more. On the other hand, in the case of using only a solid-phase epitaxial growth method for forming the second single crystal semiconductor layer 114, there arises a problem that the semiconductor layer is separated due to heat treatment. This is thought to be a result from a large amount of hydrogen contained in the semiconductor layer (for example, an amorphous semiconductor layer) immediately after the film formation.

In this embodiment, after forming the first semiconductor layer 113A thin by vapor-phase growth (vapor-phase epitaxial growth), and forming the first semiconductor layer 113B thick, the second single crystal semiconductor layer 114 is formed by solid-phase growth (solid-phase epitaxial growth). In this manner, the deposition rate is ensured and at the same time, the problem that the semiconductor layer is separated can be solved. In other words, a single crystal semiconductor layer can be formed with high productivity and a high yield.

It is likely that the problem that the semiconductor layer is separated can be reduced by forming a stacked-layer structure of a semiconductor layer having high crystallinity and a semiconductor layer having low crystallinity over a single crystal semiconductor layer and then performing solid-phase growth as in this embodiment because the difference in crystallinity between the adjacent layers is reduced and the bonding between atoms at the interface is strengthened, and thus the adhesion is increased.

In view of the reason described above, the present invention should not be interpreted as being limited to this embodiment in which a semiconductor layer having high crystallinity (the first semiconductor layer 113A) is formed between a single crystal semiconductor layer (the first single crystal semiconductor layer 112) and a semiconductor layer having low crystallinity (the first semiconductor layer 113B). That is, a plurality of semiconductor layers having different crystallinity may be provided between the single crystal semiconductor layer and the semiconductor layer having low crystallinity. For example, a semiconductor layer having high crystallinity, a semiconductor layer having slightly higher crystallinity, and a semiconductor layer having low crystallinity are formed over the single crystal semiconductor layer in this order. With this structure, adhesion can be further improved.

In addition, in view of the adhesion at the interface, the above-described stacked-layer structure is preferably formed so as to be exposed to the air as little as possible. For example, the first semiconductor layer 113A and the first semiconductor layer 113B may be successively formed in the same chamber.

Figure 11A:
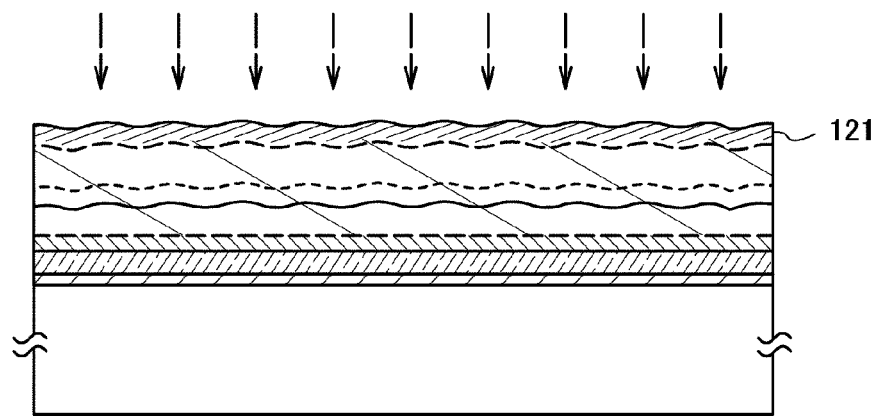
FIGS. 11A to 11C are cross-sectional views illustrating an example of a method for manufacturing a photoelectric conversion device using an SOI substrate according to an embodiment of the present invention.

Next, an impurity element imparting a different conductivity type from that of the first impurity semiconductor layer 115 is added through one surface of the second single crystal semiconductor layer 114 (the surface which is not in contact with the first single crystal semiconductor layer 112) to form the second impurity semiconductor layer 121 (see FIG. 11A). For example, phosphorus or arsenic is added as the impurity element to form the second impurity semiconductor layer 121 having n-type conductivity. If the base substrate 110 is a glass substrate, the substrate cannot resist process temperature in a thermal diffusion method; therefore, the impurity element is added by ion implantation or ion doping.

Alternatively, the second impurity semiconductor layer 121 may be formed using an amorphous semiconductor, over the second single crystal semiconductor layer 114. Using amorphous semiconductor for the second impurity semiconductor layer 121 does not cause a significant problem because a region mainly serving as a photoelectric conversion layer is formed using the single crystal semiconductor layer.

Note that the thickness of the second impurity semiconductor layer 121 is preferably about 20 nm to 200 nm inclusive, more preferably 50 nm to 100 nm inclusive. By forming the second impurity semiconductor layer 121 thin, recombination of carriers in the second impurity semiconductor layer 121 can be prevented.

In this manner, a unit cell 130 can be obtained in which the first impurity semiconductor layer 115 having one conductivity type, the first single crystal semiconductor layer 125, the second single crystal semiconductor layer 114, and the second impurity semiconductor layer 121 having a different conductivity type from the one conductivity type are stacked in this order.

Figure 11B:
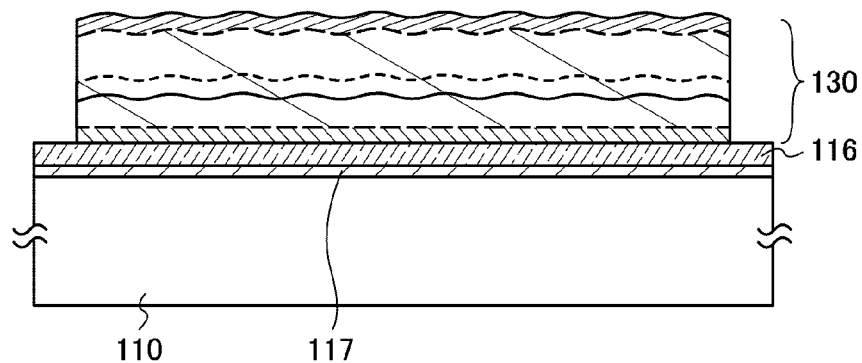

Then, the first impurity semiconductor layer 115 formed over the first conductive layer 116, the first single crystal semiconductor layer 125, the second single crystal semiconductor layer 114, and the second impurity semiconductor layer 121, which are formed over the first conductive layer 116, are etched to expose part of the first conductive layer 116 (preferably an end portion of the first conductive layer 116) (see FIG. 11B).

Here, the purpose of exposing part of the first conductive layer 116 is to form an auxiliary electrode (or an auxiliary wiring) later. In order that the photoelectric conversion device 150 may function, electric energy needs to be extracted from electrodes corresponding to a positive electrode and a negative electrode. However, since an upper portion of the first conductive layer 116 is covered with the single crystal semiconductor layer and the like, and the base substrate 110 is provided under the first conductive layer 116, extracting electric energy is difficult in this structure. To solve such a problem, part of the layers formed over the first conductive layer 116 is etched to expose part of the first conductive layer 116 and to form an auxiliary electrode (or an auxiliary wiring) which can be led.

Specifically, the etching may be performed using a mask which is formed over the second impurity semiconductor layer 121 using a resist or an insulating layer such as a silicon nitride layer. The etching may be performed by dry etching with use of a fluorine based gas such as $NF_3$ or $SF_6$ under the condition in which at least the etching selectivity of the layers (the first impurity semiconductor layer 115, the first single crystal semiconductor layer 125, the second single crystal semiconductor layer 114, and the second impurity semiconductor layer 121) formed over the first conductive layer 116 to the first conductive layer 116 is sufficiently high. Note that after the etching, the mask is removed because it is no longer necessary.

Although this embodiment shows an example in which the first conductive layer 116 is exposed after the formation of the second impurity semiconductor layer 121, the second impurity semiconductor layer 121 may be formed after the exposure of the first conductive layer 116.

Figure 11C:
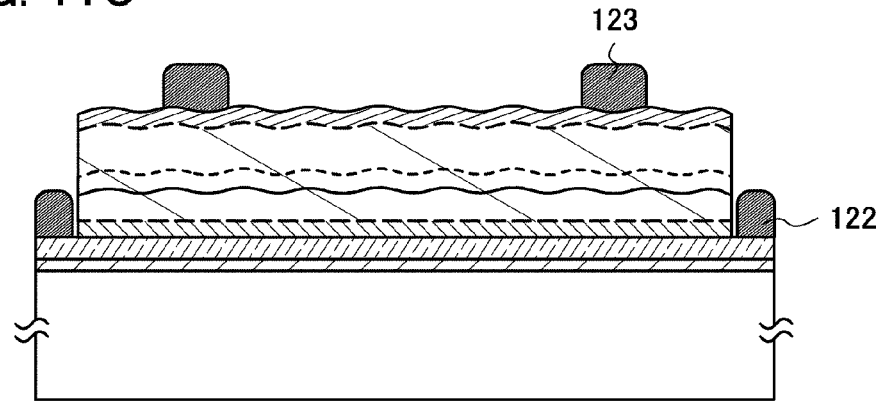

Then, an auxiliary electrode 122 is formed so as to be in contact with the exposed first conductive layer 116, and a second electrode 123 is formed on the second impurity semiconductor layer 121 (see FIG. 11C).

The auxiliary electrode 122 facilitates extraction of electric energy which is converted from light. That is, the auxiliary electrode 122 serves as an extraction electrode (also referred to as a collection electrode).

Figure 12:
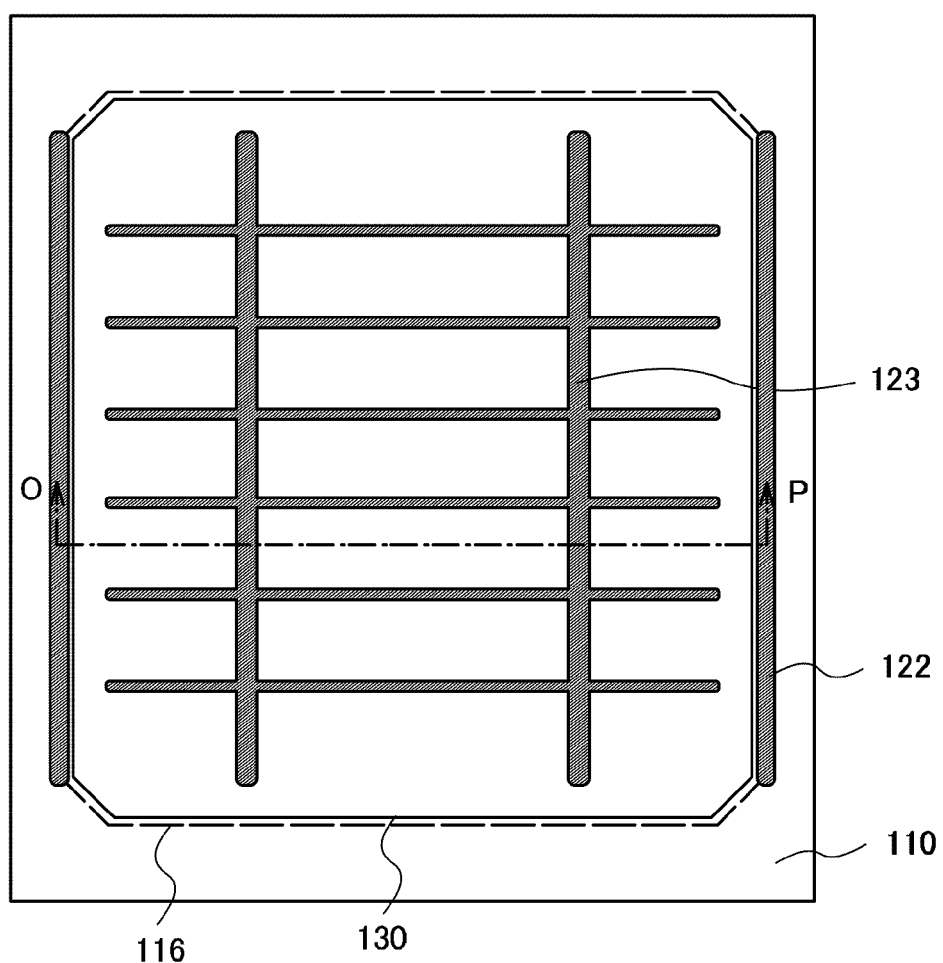
FIG. 12 is a plan view illustrating an example of a photoelectric conversion device to which an SOI substrate according to an embodiment of the present invention is applied.

The second electrode 123 is formed so as to have a grid shape (or a comb-like shape or a pectinate shape) as seen from above, as shown in FIG. 12. Thus, the unit cell 130 can be irradiated with enough light and light absorption efficiency of the unit cell 130 can be increased. The shape of the second electrode 123 is not particularly limited. It is needless to say that the light absorption efficiency is increased as the area of the second electrode 123 over the unit cell 130 (over the second impurity semiconductor layer 121) is smaller. Note that the second electrode 123 can be formed in a same process as that of the auxiliary electrode 122.

The auxiliary electrode 122 and the second electrode 123 may be formed using aluminum, silver, lead-tin (solder), or the like by a printing method or the like. For example, the auxiliary electrode 122 and the second electrode 123 can be formed using a silver paste by a screen printing method.

In the above manner, the photoelectric conversion device 150 can be manufactured.

Figure 13:
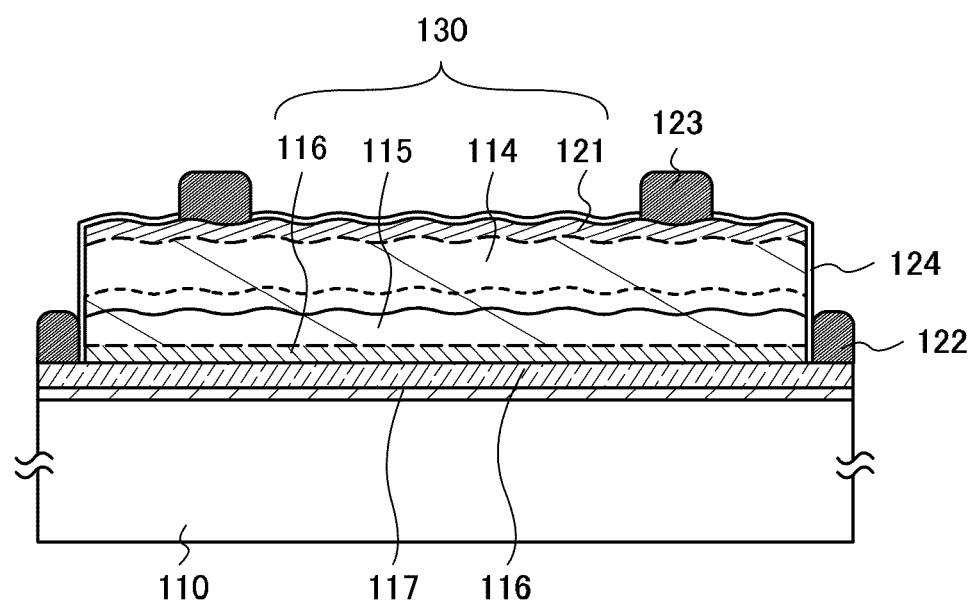
FIG. 13 is a cross-sectional view illustrating an example of a photoelectric conversion device to which an SOI substrate according to an embodiment of the present invention is applied.

Note that a passivation layer 124 having an anti-reflection function is preferably formed over the unit cell 130 (see FIG. 13).

For the passivation layer 124, a material whose refractive index is between the refractive indices of air and incident surface of the unit cell 130 (in this embodiment, the first impurity semiconductor layer 118) is used. In addition, a material which transmits light with a predetermined wavelength is used so that light incidence to the unit cell 130 is not interrupted. By using such a material, reflection at the light incident surface of the unit cell 130 can be prevented. Note that as such a material, silicon nitride, silicon nitride oxide, magnesium fluoride, and the like can be given.

The passivation layer 124 is provided with openings so as to expose part of the auxiliary electrode 122 and the second electrode 123. For example, after the passivation layer 124 is formed over the unit cell 130, the passivation layer 124 is etched so as to expose part of the second impurity semiconductor layer 121 and part of the first conductive layer 116. Then, the auxiliary electrode 122 in contact with the first conductive layer 116 and the second electrode 123 in contact with the second impurity semiconductor layer 121 are formed. Alternatively, the passivation layer 124 may be formed to have an opening by applying a lift-off method or the like.

Note that in this embodiment, the single crystal semiconductor layer is formed thick with the use of epitaxial growth technology. The total thickness of the first single crystal semiconductor layer 125 and the second single crystal semiconductor layer 114 is 800 nm or more. Therefore, enough carriers can be generated in the single crystal semiconductor layer and thus photoelectric conversion efficiency can be increased.

As described above, with an epitaxial growth technique described in this embodiment, the single crystal semiconductor layer with a thickness of 800 nm or more, preferably 1000 nm or more which functions as a photoelectric conversion layer can be obtained. By the epitaxial growth technique, the consumption of single crystal semiconductor can be suppressed as compared to the case of using a bulk single crystal semiconductor substrate. Note that a portion supporting the photoelectric conversion device has been conventionally formed using a single crystal semiconductor; however, by using a single crystal semiconductor layer separated as a thin slice from a single crystal semiconductor substrate, the consumption of single crystal semiconductor can be significantly suppressed. Further, the single crystal semiconductor substrate from which the single crystal semiconductor layer has been separated can be reused repeatedly; therefore, the resources can be effectively used.

In addition, in this embodiment, the second single crystal semiconductor layer is formed using a stacked-layer structure of the first semiconductor layer having high crystallinity (the hydrogen concentration is low, the amount of hydrogen contained is small) and the second semiconductor layer having low crystallinity (the hydrogen concentration is high, the amount of hydrogen contained is large). Thus, the second single crystal semiconductor layer can be prevented from being separated even when the second single crystal semiconductor layer is formed thick. That is, the second semiconductor layer can be thick enough to enhance the productivity and the second semiconductor layer is prevented form separation due to the large thickness; accordingly, a photoelectric conversion layer with a necessary thickness can be formed efficiently, with a high yield, and using the minimum material.

This embodiment can be implemented in combination with any of the other embodiments as appropriate.

EXAMPLE 1

In this example, a result of measuring the number of defects at the bonding interface between a single crystal semiconductor substrate and a base substrate is shown.

In this example, a single crystal silicon substrate was prepared as a single crystal semiconductor substrate. After a first silicon oxide film (hereinafter also referred to as a radical oxide film) was formed to a thickness of about 10 nm by radical treatment over the single crystal silicon substrate, hydrogen ion irradiation was performed to form an embrittlement region. Next, a second silicon oxide film was formed to a thickness of 100 nm using TEOS and $O_2$ over the first silicon oxide film. Next, a silicon nitride oxide film was formed to a thickness of 50 nm over the second silicon oxide film. In addition, a glass substrate was prepared, and the silicon nitride oxide film and the glass substrate were bonded to each other. Then, separation along the embrittlement region is performed to form a single crystal silicon layer over the glass substrate with the silicon nitride oxide film and the first and second silicon oxide films interposed therebetween.

Next, treatment using ozone water containing hydroxyradical was performed on a single crystal silicon substrate to form a first silicon oxide film (hereinafter also referred to as a hydro oxide film) to a thickness of several nm, and then hydrogen irradiation was performed. Next, a second silicon oxide film was formed to a thickness of 100 nm using TEOS and $O_2$ over the first silicon oxide film. Next, a silicon nitride oxide film was formed to a thickness of 50 nm over the (second) silicon oxide film. In addition, a glass substrate was prepared and the silicon nitride oxide film and the glass substrate were bonded to each other. Then, separation along the embrittlement region is performed to form a single crystal silicon layer over the glass substrate with the silicon nitride oxide film and the first and second silicon oxide film interposed therebetween.

After that, surfaces of the single crystal silicon layers formed over the glass substrates were observed using a dust inspection machine (GI-4600, a glass substrate surface inspection device manufactured by Hitachi Electronics Engineering Co., Ltd.).

In the case of forming the hydro oxide film over the single crystal semiconductor substrate and then forming the TEOS film and the silicon nitride film, the number of defects inspected was 86. Whereas in the case of forming a radical oxide film over the single crystal silicon substrate and then forming the TEOS film and the silicon nitride film, the number of defects inspected was only 22.

In a case of using a hydro oxide film, an oxide film can be formed to a thickness of several nm; however, it is difficult to be formed with a uniform quality and thickness. Accordingly, it seems that a surface of the film became rough when being irradiated with hydrogen ions. By forming the silicon oxide film and the silicon nitride oxide film over the hydro oxide film having a rough surface, the surface unevenness of the silicon nitride oxide film is further increased, and a plurality of defects were probably caused at the bonding interface with the base substrate as a reflection of the surface unevenness of the silicon nitride oxide film. On the other hand, it seems that since a radical oxide film can be formed with a uniform quality and thickness, surface roughness of the film could be suppressed when being irradiated with hydrogen ions. Thus, the silicon oxide film and the silicon nitride oxide film formed over the radical oxide film were unlikely to be affected by the surface unevenness of the radical oxide film and were able to be formed planar, resulting in suppressing defects at the bonding interface with the base substrate.

This application is based on Japanese Patent Application serial No. 2008-257762 filed with Japan Patent Office on Oct. 2, 2008, the entire contents of which are hereby incorporated by reference.

What is claimed is:

1. A method for forming an SOI substrate comprising the steps of:
   performing a first radical treatment on a semiconductor substrate to form a silicon oxide film;
   performing a second radical treatment on the semiconductor substrate to nitride the silicon oxide film, so that a first insulating film comprising silicon oxynitride is formed on the semiconductor substrate;
   irradiating the semiconductor substrate with ions through the first insulating film to form an embrittlement region in the semiconductor substrate;
   forming a second insulating film over the first insulating film, after the step of irradiating;
   bonding a surface of the second insulating film and a surface of a base substrate, after the step of forming the second insulating film;
   performing heat treatment to form a semiconductor layer over the base substrate by separating the semiconductor substrate along the embrittlement region, after the step of bonding;
   etching the semiconductor layer over the base substrate; and
   irradiating the semiconductor layer with a laser beam, after the step of etching.

2. A method for forming the SOI substrate according to claim 1, wherein a thickness of the semiconductor layer to be removed by the etching is greater than or equal to 1 nm and less than or equal to 30 nm.

3. A method for forming the SOI substrate according to claim 1, wherein a thickness of the first insulating film is greater than or equal to 1 nm and less than or equal to 10 nm.

4. A method for forming the SOI substrate according to claim 1, the first radical treatment comprising the steps of:
   exciting a gas containing oxygen to generate oxygen radicals; and
   oxidizing a surface of the semiconductor substrate by the oxygen radicals.

5. A method for forming the SOI substrate according to claim 1, wherein the step of irradiating with ions is performed using an ion doping apparatus.

6. A method for forming the SOI substrate according to claim 1, wherein the ions include $H_3^+$ ion as a main component.

7. A method for forming the SOI substrate according to claim 1, wherein a temperature in the heat treatment for separating is below a strain point of the base substrate.

8. A method for forming the SOI substrate according to claim 1, wherein the base substrate is aluminosilicate glass, barium borosilicate glass, aluminoborosilicate glass, quartz, ceramic, or sapphire.

9. A method for forming an SOI substrate comprising the steps of:
   performing a first radical treatment on a semiconductor substrate to form a silicon nitride film;
   performing a second radical treatment on the semiconductor substrate to oxidize the silicon nitride film, so that a first insulating film comprising silicon nitride oxide is formed on the semiconductor substrate;
   irradiating the semiconductor substrate with ions through the first insulating film to form an embrittlement region in the semiconductor substrate;
   forming a second insulating film over the first insulating film, after the step of irradiating;
   bonding a surface of the second insulating film and a surface of a base substrate, after the step of forming the second insulating film;
   performing heat treatment to form a semiconductor layer over the base substrate by separating the semiconductor substrate along the embrittlement region, after the step of bonding;
   etching the semiconductor layer over the base substrate; and
   irradiating the semiconductor layer with a laser beam, after the step of etching.

10. A method for forming the SOI substrate according to claim 9, wherein a thickness of the semiconductor layer to be removed by the etching is greater than or equal to 1 nm and less than or equal to 30 nm.

11. A method for forming the SOI substrate according to claim 9, wherein a thickness of the first insulating film is greater than or equal to 1 nm and less than or equal to 10 nm.

12. A method for forming the SOI substrate according to claim 9, the first radical treatment comprising the steps of:
   exciting a gas containing nitrogen to generate nitrogen radicals or hydrogen nitride radicals; and
   nitriding a surface of the semiconductor substrate by the nitrogen radicals or the hydrogen nitride radicals.

13. A method for forming the SOI substrate according to claim 9, wherein the step of irradiating with ions is performed using an ion doping apparatus.

14. A method for forming the SOI substrate according to claim 9, wherein the ions include $H_3^+$ ion as a main component.

15. A method for forming the SOI substrate according to claim 9, wherein a temperature in the heat treatment for separating is below a strain point of the base substrate.

16. A method for forming the SOI substrate according to claim 9, wherein the base substrate is aluminosilicate glass, barium borosilicate glass, aluminoborosilicate glass, quartz, ceramic, or sapphire.

* * * * *